United States Patent
Chu et al.

(10) Patent No.: US 9,972,603 B2
(45) Date of Patent: May 15, 2018

(54) SEAL-RING STRUCTURE FOR STACKING INTEGRATED CIRCUITS

(71) Applicant: Taiwan Semiconductor Manufacturing Co., Ltd., Hsin-Chu (TW)

(72) Inventors: Yi-Shin Chu, Hsinchu (TW); Kuan-Chieh Huang, Hsinchu (TW); Pao-Tung Chen, Tainan Hsien (TW); Shuang-Ji Tsai, Tainan (TW); Yi-Hao Chen, Taichung (TW); Feng-Kuei Chang, Changahua (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days. days.

(21) Appl. No.: 15/383,419

(22) Filed: Dec. 19, 2016

(65) Prior Publication Data

US 2017/0186732 A1    Jun. 29, 2017

Related U.S. Application Data

(60) Provisional application No. 62/272,203, filed on Dec. 29, 2015.

(51) Int. Cl.
*H01L 21/768* (2006.01)
*H01L 23/31* (2006.01)
(Continued)

(52) U.S. Cl.
CPC .... *H01L 25/0657* (2013.01); *H01L 21/31111* (2013.01); *H01L 21/76898* (2013.01);
(Continued)

(58) Field of Classification Search
CPC .......... H01L 25/50; H01L 2225/06541; H01L 23/3114; H01L 23/585; H01L 2224/24145;
(Continued)

(56) References Cited

U.S. PATENT DOCUMENTS 8,802,504 B1   8/2014   Hou et al.
8,803,292 B2   8/2014   Chen et al.
(Continued)

FOREIGN PATENT DOCUMENTS

JP   2011129722 A   6/2011
JP   2012204444 A   10/2012

*Primary Examiner* — Jasmine Clark
(74) *Attorney, Agent, or Firm* — Eschweiler & Potashnik, LLC

(57) ABSTRACT

A three-dimensional (3D) integrated circuit (IC) die is provided. In some embodiments, a first IC die comprises a first semiconductor substrate, a first interconnect structure over the first semiconductor substrate, and a first hybrid bond (HB) structure over the first interconnect structure. The first HB structure comprises a HB link layer and a HB contact layer extending from the HB link layer to the first interconnect structure. A second IC die is over the first IC die, and comprises a second semiconductor substrate, a second HB structure, and a second interconnect structure between the second semiconductor substrate and the second HB structure. The second HB structure contacts the first HB structure. A seal-ring structure is in the first and second IC dies. Further, the seal-ring structure extends from the first semiconductor substrate to the second semiconductor substrate, and is defined in part by the HB contact layer.

20 Claims, 25 Drawing Sheets

(51) Int. Cl.
*H01L 25/065* (2006.01)
*H01L 21/311* (2006.01)
*H01L 23/48* (2006.01)
*H01L 23/522* (2006.01)
*H01L 23/528* (2006.01)
*H01L 23/58* (2006.01)
*H01L 23/00* (2006.01)
*H01L 25/00* (2006.01)

(52) U.S. Cl.
CPC ........ *H01L 23/3171* (2013.01); *H01L 23/481* (2013.01); *H01L 23/528* (2013.01); *H01L 23/5226* (2013.01); *H01L 23/585* (2013.01); *H01L 24/19* (2013.01); *H01L 24/24* (2013.01); *H01L 24/82* (2013.01); *H01L 25/50* (2013.01); *H01L 2224/24145* (2013.01); *H01L 2225/06541* (2013.01)

(58) Field of Classification Search
CPC ....... H01L 24/24; H01L 24/82; H01L 23/481; H01L 21/76898; H01L 23/5226; H01L 25/043; H01L 2224/82; H01L 21/31111; H01L 2224/19; H01L 2224/93; H01L 2224/24146; H01L 25/0657
See application file for complete search history.

(56) References Cited

U.S. PATENT DOCUMENTS

| | | | |
|---|---|---|---|
| 8,803,316 | B2 | 8/2014 | Lin et al. |
| 8,906,781 | B2* | 12/2014 | Jeon ................... H01L 21/76898 438/455 |
| 8,916,448 | B2* | 12/2014 | Cheng ................... H01L 23/488 257/777 |
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,496,189 | B2 | 11/2016 | Yu et al. |
| 2004/0150070 | A1 | 8/2004 | Okada et al. |
| 2010/0171203 | A1 | 7/2010 | Chen et al. |
| 2012/0104541 | A1 | 5/2012 | Chiu |
| 2012/0241981 | A1 | 9/2012 | Hirano |
| 2012/0252189 | A1* | 10/2012 | Sadaka ................... H01L 24/05 438/455 |
| 2014/0124889 | A1 | 5/2014 | Qian et al. |
| 2015/0194455 | A1 | 7/2015 | Ho et al. |
| 2016/0190103 | A1 | 6/2016 | Kabe et al. |

* cited by examiner

SEAL-RING STRUCTURE FOR STACKING INTEGRATED CIRCUITS

REFERENCE TO RELATED APPLICATION

This application claims the benefit of U.S. Provisional Application No. 62/272,203, filed on Dec. 29, 2015, the contents of which are incorporated by reference in their entirety.

BACKGROUND

The semiconductor industry has continually improved the processing capabilities and power consumption of integrated circuits (ICs) by shrinking the minimum feature size. However, in recent years, process limitations have made it difficult to continue shrinking the minimum feature size. The stacking of two-dimensional (2D) ICs into three-dimensional (3D) ICs has emerged as a potential approach to continue improving processing capabilities and power consumption of ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
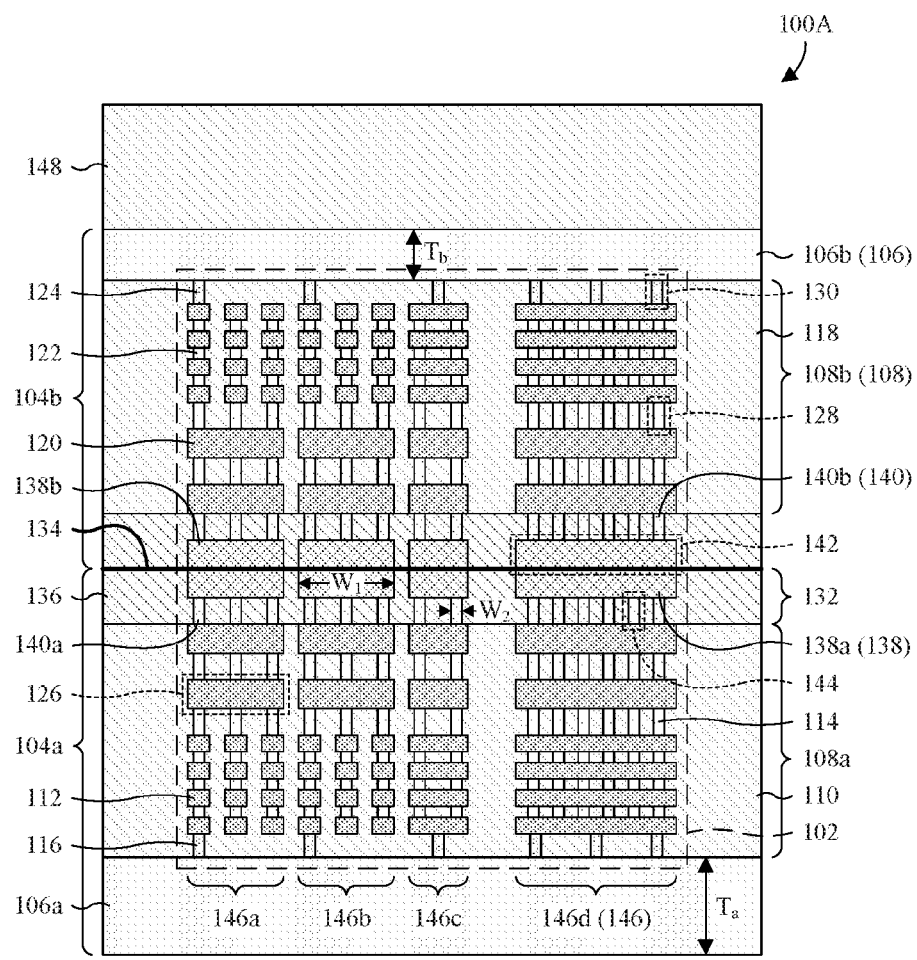
FIG. 1A illustrates a cross-sectional view of some embodiments of a three-dimensional (3D) integrated circuit (IC) die with a seal-ring structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., conductive wire) may be referred to as a "first" element in some embodiments, the element may be referred to as a "second" element in other embodiments.

One type of three-dimensional (3D) integrated circuit (IC) die comprises a first IC die and a second IC die over the first IC die. The first and second IC dies are two-dimensional (2D) IC dies, and comprise respective semiconductor substrates, respective interconnect structures between the semiconductor substrates, and respective hybrid bond (HB) structures between the interconnect structures. The interconnect structures comprise alternating stacks of wiring layers and via layers. The hybrid bond structures comprise respective HB dielectric layers, respective HB link layers, and respective HB contact layers. The HB dielectric layers contact at a HB interface between the first and second IC dies. The HB link layers are sunken into the HB dielectric layers and also contact at the HB interface. The HB contact layers extend respectively from the HB link layers respectively to the interconnect structures.

The 3D IC die further comprises a seal-ring structure in the first and second IC dies, and a passivation layer covering the second IC die. The seal-ring structure laterally encloses a 3D IC of the first and second IC dies, and extends respectively from and to the semiconductor substrates, such that the seal-ring structure provides a wall protecting the 3D IC. For example, the seal-ring structure may protect the 3D IC from a die saw and/or gases diffusing into the 3D IC die. The seal-ring structure is defined with the wiring layers, the via layers, and the HB link layers. However, the seal-ring structure is not defined with the HB contact layers, such that the seal-ring structure is discontinuous respectively from and to the semiconductor substrates. This may, in turn, lead to poor reliability and/or performance. For example, gases may diffuse to the 3D IC through gaps in the seal-ring structure at the HB contact layers. Further, the passivation layer accommodates pad structures directly over the 3D IC to provide electrical coupling with the 3D IC. However, the passivation layer does not accommodate pad structures directly over the seal-ring structure, such that top usage of the 3D IC die is poor and the 3D IC die may have a large footprint so as to accommodate a sufficient number of pad structures.

In view of the foregoing, various embodiments of the present application are directed towards a 3D IC die in which a seal-ring structure is defined with HB contact layers, and/or in which pad structures are directly over the seal-ring structure. For example, in some embodiments, a first IC die comprises a first semiconductor substrate, a first interconnect structure over the first semiconductor substrate, and a first HB structure over the first interconnect structure. The first HB structure comprises a HB link layer and a HB contact layer extending from the HB link layer to the first interconnect structure. A second IC die is over the first IC die. The second IC die comprises a second semiconductor substrate, a second HB structure, and a second interconnect structure between the second semiconductor substrate and the second HB structure. The second HB structure contacts the first HB structure at a HB interface. A seal-ring structure is in the first and second IC dies, and is defined in part with the HB contact layer. Further, the seal-ring structure extends from the first semiconductor substrate to the second semiconductor substrate. Advantageously, by using the HB contact layer to define the seal-ring structure, the seal-ring structure may extend continuously from the first semiconductor substrate to the second semiconductor substrate, such that the seal-ring structure may have robust reliability and performance.

With reference to FIG. 1A, a cross-sectional view 100A of some embodiments of a 3D IC die with a seal-ring structure 102 is provided. As illustrated, a first IC die 104a supports a second IC die 104b. The first and second IC dies 104a, 104b are 2D IC dies and comprise respective semiconductor substrates 106. The semiconductor substrates 106 are spaced from one another, respectively under and over the seal-ring structure 102. In some embodiments, the semiconductor substrates 106 are bulk substrates of monocrystalline silicon or some other semiconductor, some other type of semiconductor substrate, or a combination of the foregoing. Further, in some embodiments, the semiconductor substrates 106 have respective thicknesses that are different. For example, a first semiconductor substrate 106a of the first IC die 104a may have a first thickness $T_a$ and a second semiconductor substrate 106b of the second IC die 104b may have a second thickness $T_b$ greater than the first thickness.

Interconnect structures 108 respectively of the first and second IC dies 104a, 104b are between the semiconductor substrates 106 and are spaced from one another. A first interconnect structure 108a of the first IC die 104a comprises a first interlayer dielectric (ILD) layer 110, first wiring layers 112, first inter-wire via layers 114, and a first device contact layer 116. Similarly, a second interconnect structure 108b of the second IC die 104b comprises a second ILD layer 118, second wiring layers 120, second inter-wire via layers 122, and a second device contact layer 124. The first and second ILD layers 110, 118 may be, for example, silicon dioxide, a low κ dielectric, some other dielectric, or a combination of the foregoing. As used here, a low κ dielectric is a dielectric with a dielectric constant κ less than about 3.9.

The first wiring layers 112 are alternatingly stacked with the first inter-wire via and device contact layers 114, 116 in the first ILD layer 110, such that the first device contact layer 116 borders the first semiconductor substrate 106a. Similarly, the second wiring layers 120 are alternatingly stacked with the second inter-wire via and device contact layers 122, 124 in the second ILD layer 118, such that the second device contact layer 124 borders the second semiconductor substrate 106b. The first and second wiring layers 112, 120 are made up of wires 126, the first and second inter-wire via layers 114, 122 are made up of inter-wire vias 128, and the first and second device contact layers 116, 124 are made up of device contacts 130. Further, the first and second wiring layers 112, 120, the first and second inter-wire via layers 114, 122, and the first and second device contact layers 116, 124 are conductive and may be, for example, aluminum copper, copper, aluminum, tungsten, some other metal or conductive material, or a combination of the foregoing.

In some embodiments, the first wiring layers 112 are integrated respectively with, and/or the same materials respectively as, immediately underlying layers of the first inter-wire via and device contact layers 114, 116. In other embodiments, the first wiring layers 112 are distinct respectively from, and/or different materials respectively than, immediately underlying layers of the first inter-wire via and device contact layers 114, 116. Similarly, in some embodiments, the second wiring layers 120 are integrated respectively with, and/or the same materials respectively as, immediately overlying layers of the second inter-wire via and device contact layers 122, 124. In other embodiments, the second wiring layers 120 are respectively distinct from, and/or different materials respectively than, immediately overlying layers of the second inter-wire via and device contact layers 122, 124

HB structures 132 respectively of the first and second IC dies 104a, 104b are between the interconnect structures 108 and contact at a HB interface 134. The HB structures 132 comprise respective HB dielectric layer 136, respective HB link layers 138, and respective HB contact layers 140. The HB dielectric layers 136 contact at the HB interface 134 to define a dielectric-to-dielectric interface. Further, the HB dielectric layers 136 may be, for example, silicon dioxide, some other dielectric, or a combination of the foregoing.

The HB link layers 138 are recessed respectively into the HB dielectric layers 136, such that HB link layers 138 are respectively flush with the HB dielectric layers 136 at the HB interface 134. Further, the HB link layers 138 contact at the HB interface 134 to define a conductor-to-conductor interface, and are electrically coupled to the interconnect structures 108, respectively, by the HB contact layers 140. The HB contact layers 140 extend respectively from the HB link layers 138 respectively to the interconnect structures 108. The HB link layers 138 are made up of HB links 142, and the HB contact layers 140 are made up of HB contacts 144. The HB links 142 may, for example, have widths $W_1$ equal to and/or greater than about 1.5 micrometers, and/or the HB contacts 144 may, for example, have widths $W_2$ between about 0.1-1.0 micrometers, such as about 0.4 micrometers. The HB link layers 138 and HB contact layers 140 are conductive and may be, for example, aluminum copper, copper, aluminum, tungsten, some other conductive material, or a combination of the foregoing.

In some embodiments, a first HB link layer 138a of the first IC die 104a is integrated with, and/or the same material as, a first HB contact layer 140a of the first IC die 104a. In other embodiments, the first HB link layer 138a is distinct from, and/or a different material than, the first HB contact layer 140a. Similarly, in some embodiments, a second HB link layer 138b of the second IC die 104b is integrated with, and/or the same material as, a second HB contact layer 140b of the second IC die 104b. In other embodiments, the second HB link layer 138b is distinct from, and/or a different material than, the second HB contact layer 140b.

The seal-ring structure 102 is arranged in the first and second IC dies 104a, 104b. The seal-ring structure 102 laterally encloses a 3D IC (not shown) of the first and second IC dies 104a, 104b, and extends respectively from one of the semiconductor substrates 106 (e.g., the first semiconductor substrate 106a) to another one of the semiconductor substrates 106 (e.g., the second semiconductor substrate 106b), such that the seal-ring structure 102 defines a wall or barrier protecting the 3D IC. For example, the seal-ring structure 102 may protect the 3D IC from a die saw singulating the first and second IC dies 104a, 104b and/or from gases diffusing into the first and second IC dies 104a, 104b from an ambient environment of the first and second IC dies 104a, 104b. Further, the seal-ring structure 102 is made up of one or more ring-shaped segments 146 that are concentrically aligned. For example, the seal-ring structure 102 may comprise a first ring-shaped segment 146a, a second ring-shaped segment 146b, a third ring-shaped segment 146c, and a fourth ring-shaped segment 146d.

The ring-shaped segment(s) 146 each laterally enclose the 3D IC of the first and second IC dies 104a, 104b, and/or each extend respectively from one of the semiconductor substrates 106 to another one of the semiconductor substrates 106. Further, the ring-shaped segment(s) 146 is/are each defined with the first and second wiring layers 112, 120 and the first and second inter-wire via layers 114, 122, and the first and second device contact layers 116, 124. For example, the first ring-shaped segment 146a may be defined by an alternating stack of device contacts, inter-wire vias, and ring-shaped wires in the interconnect structures 108. Even more, at least one of the ring-shaped segment(s) 146 is further defined with the HB link layers 138 and the HB contact layers 140. For example, the fourth ring-shaped segment 146d may be defined by an alternating stack of device contacts, inter-wire vias, and ring-shaped wires in the interconnect structures 108, as well as HB contacts and ring-shaped links in the first and second HB structures 132a, 132b. Advantageously, since at least one of the ring-shaped segment(s) 146 is further defined with the HB link layers 138 and the HB contact layers 140, the seal-ring structure 102 may define a continuous wall or barrier respectively from and to the semiconductor substrates 106 for robust reliability and performance.

A passivation layer 148 is arranged over and covers the semiconductor substrates 106. For example, the passivation layer 148 may be arranged over and contact a top surface of the second semiconductor substrate 106b. Further, in some embodiments, the passivation layer 148 accommodates one or more pad structures (not shown) directly over the seal-ring structure 102. The pad structure(s) may facilitate electrical coupling between the 3D IC die and external devices. The passivation layer 148 may be for example, silicon dioxide, silicon nitride, silicon oxynitride, silicon carbide, some other dielectric, or a combination of the foregoing.

Figure 1B:
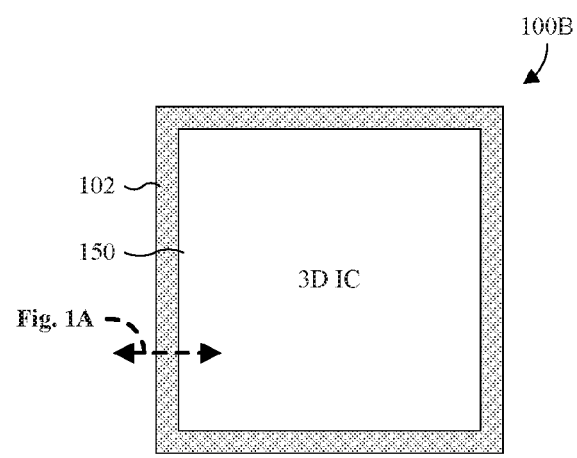
FIG. 1B illustrates a layout view of some embodiments of the 3D IC die of FIG. 1A.

With reference to FIG. 1B, a layout view 100B of some embodiments of the 3D IC die of FIG. 1 is provided. As illustrated, the seal-ring structure 102 laterally encloses a 3D IC 150, and extends laterally along a periphery of the 3D IC die. The 3D IC 150 is defined with the first and second IC dies 104a, 104b of FIG. 1A, and is made up of a plurality of semiconductor devices (not shown) and the interconnections between the semiconductor devices. In some embodiments, the semiconductor devices are active and/or passive devices, and/or are in the semiconductor substrates 106 of FIG. 1A and/or the interconnect structures 108 of FIG. 1A. For example, the semiconductor devices may comprise insulated-gate field-effect transistors (IGFETs) or metal-oxide-semiconductor field-effect transistors (MOSFETs) arranged in the semiconductor substrates 106 of FIG. 1A. As another example, the semiconductor devices may comprise metal-insulator-metal (MIM) capacitors, resistive random-access memory (RRAM), or spiral inductors arranged in the interconnect structures 108 of FIG. 1A.

With reference to FIGS. 2A-2D, cross-sectional views 200A-200D of other embodiments of the 3D IC die of FIG. 1A are provided in which HB links of the HB link layers 138 and HB contacts of the HB contact layers 140 are omitted from at least one, but not all, of the ring-shaped segment(s) 146.

Figure 2A:
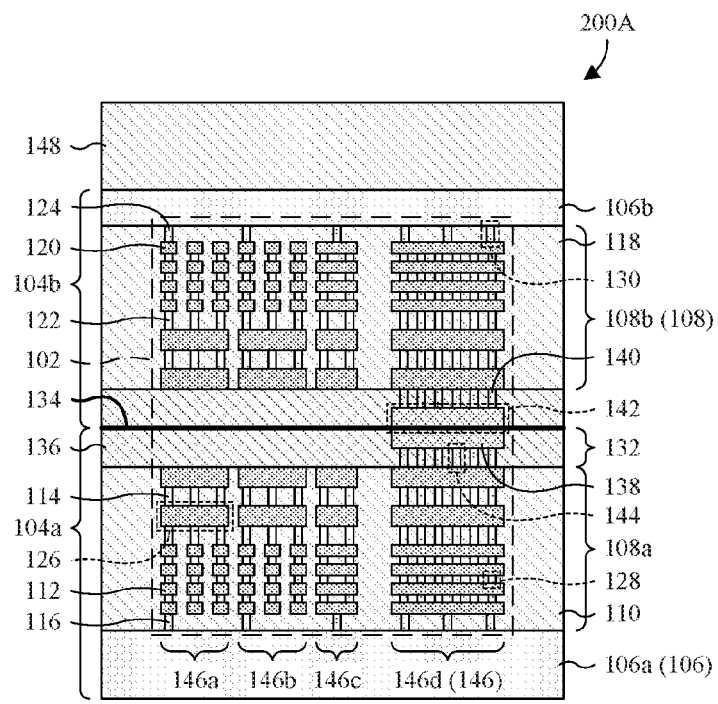
FIGS. 2A-2D illustrate cross-sectional views of other embodiments of the 3D IC die of FIG. 1A in which hybrid bond (HB) links and HB contacts are omitted from select ring-shaped segments of the seal-ring structure.
Figure 2B:
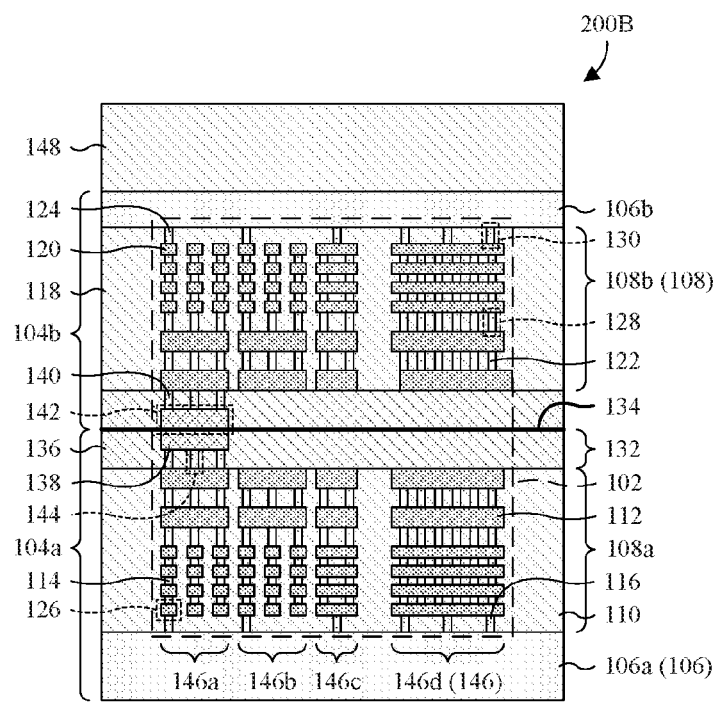

As illustrated by the cross-sectional views 200A, 200B respectively of FIGS. 2A and 2B, HB links of the HB link layers 138 and HB contacts of the HB contact layers 140 are omitted from three of four ring-shaped segments. In particular, HB links of the HB link layers 138 and HB contacts of the HB contact layers 140 are omitted from the first, second, and third ring-shaped segments 146a, 146b, 146c, but not the fourth ring-shaped segment 146d, in the embodiments of FIG. 2A. Further, HB links of the HB link layers 138 and HB contacts of the HB contact layers 140 are omitted from the second, third, and fourth ring-shaped segments 146b, 146c, 146d, but not the first ring-shaped segment 146a, in the embodiments of FIG. 2B.

While not illustrated, HB links of the HB link layers 138 and HB contacts of the HB contact layers 140 may be omitted from the first, second, and fourth ring-shaped segments 146a, 146b, 146d, but not the third ring-shaped segment 146c, in other embodiments. Further, HB links of the HB link layers 138 and HB contacts of the HB contact layers 140 may be omitted from the first, third, and fourth ring-shaped segments 146a, 146c, 146d, but not the second ring-shaped segment 146b, in other embodiments.

Figure 2C:
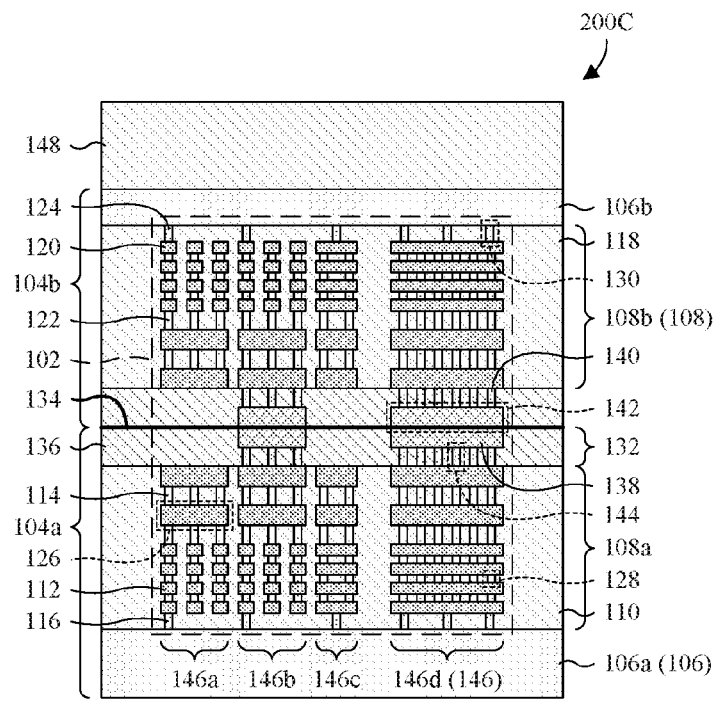

As illustrated by the cross-sectional view 200C of FIG. 2C, HB links of the HB link layers 138 and HB contacts of the HB contact layers 140 are omitted from two of four ring-shaped segments. In particular, HB links of the HB link layers 138 and HB contacts of the HB contact layers 140 are omitted from the first and third ring-shaped segments 146a, 146c, but not the second and fourth ring-shaped segments 146b, 146d, in the embodiments of FIG. 2C.

While not illustrated, HB links of the HB link layers 138 and HB contacts of the HB contact layers 140 may be omitted from the first and second ring-shaped segments 146a, 146b, but not the third and fourth ring-shaped segments 146c, 146d, in other embodiments. Further, HB links of the HB link layers 138 and HB contacts of the HB contact layers 140 may be omitted from the second and third ring-shaped segments 146b, 146c, but not the first and fourth ring-shaped segments 146a, 146d, in other embodiments. Further, HB links of the HB link layers 138 and HB contacts of the HB contact layers 140 may be omitted from the third and fourth ring-shaped segments 146c, 146d, but not the first and second ring-shaped segments 146a, 146b, in other embodiments. Further, HB links of the HB link layers 138 and HB contacts of the HB contact layers 140 may be omitted from the second and fourth ring-shaped segments 146b, 146d, but not the first and third ring-shaped segments 146a, 146c, in other embodiments. Further, HB links of the HB link layers 138 and HB contacts of the HB contact layers 140 may be omitted from the first and fourth ring-shaped segments 146a, 146d, but not the second and third ring-shaped segments 146b, 146c, in other embodiments.

Figure 2D:
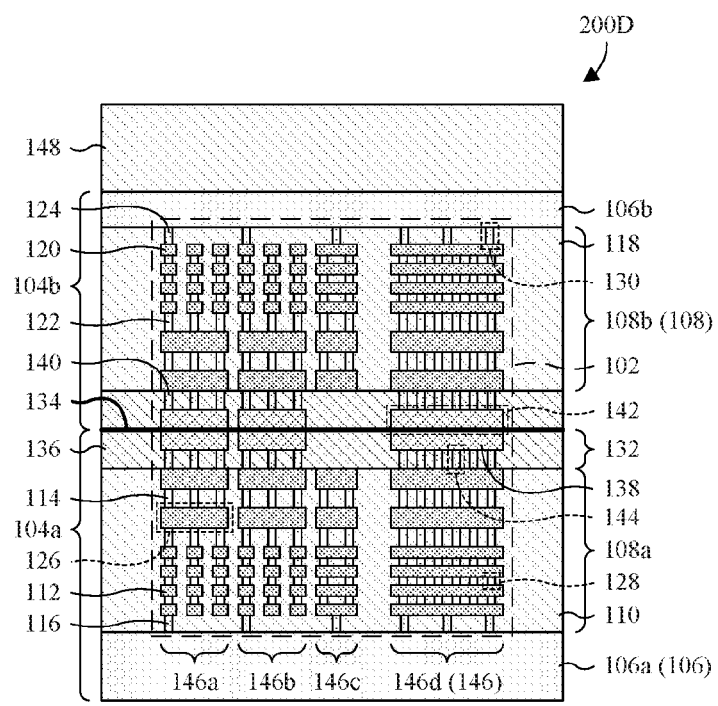

As illustrated by the cross-sectional view 200D of FIG. 2D, HB links of the HB link layers 138 and HB contacts of the HB contact layers 140 are omitted from one of four ring-shaped segments. In particular, HB links of the HB link layers 138 and HB contacts of the HB contact layers 140 are omitted from the second ring-shaped segment 146b, but not the first, third, and fourth ring-shaped segments 146a, 146c, 146d, in the embodiments of FIG. 2D.

While not illustrated, HB links of the HB link layers 138 and HB contacts of the HB contact layers 140 are omitted from the first ring-shaped segment 146a, but not the second, third, and fourth ring-shaped segments 146b, 146c, 146d, in other embodiments. Further, HB links of the HB link layers 138 and HB contacts of the HB contact layers 140 are omitted from the third ring-shaped segment 146c, but not the first, second, and fourth ring-shaped segments 146a, 146b, 146d, in other embodiments. Further, HB links of the HB link layers 138 and HB contacts of the HB contact layers 140 are omitted from the fourth ring-shaped segment 146d, but not the first, second, and third ring-shaped segments 146a, 146b, 146c, in other embodiments.

Figure 3A:
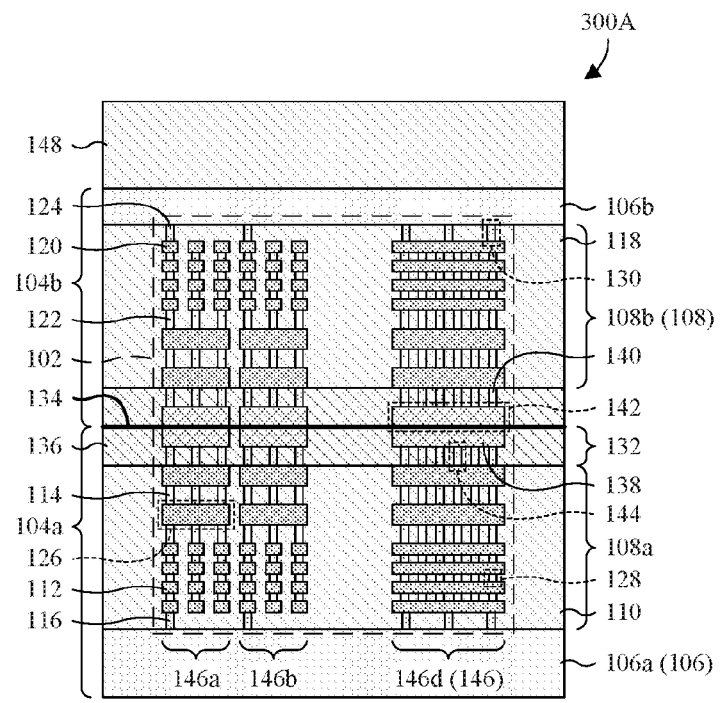
FIGS. 3A and 3B illustrate cross-sectional views of other embodiments of the 3D IC die of FIG. 1A in which the seal-ring structure includes more or less ring-shaped segments.
Figure 3B:
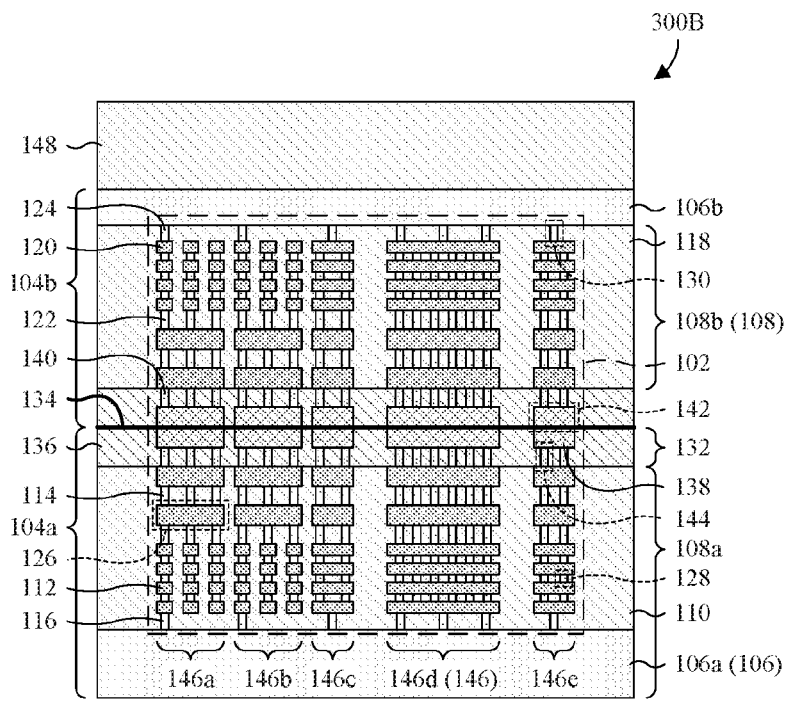

With reference to FIGS. 3A and 3B, cross-sectional views 300A, 300B of other embodiments of the 3D IC die of FIG. 1A are provided in which the seal-ring structure 102 includes more or less ring-shaped segments. These embodiments may, for example, also be combined with the embodiments of FIGS. 2A-2D.

As illustrated by the cross-sectional view 300A of FIG. 3A, one or more, but not all, of the first, second, third, and fourth ring-shaped segments 146a, 146b, 146c, 146d of FIG. 1A are omitted from the seal-ring structure 102 of FIG. 1A. In particular, the third ring-shaped segment 146c of FIG. 1A is omitted, while the first, second, and fourth ring-shaped segments 146a, 146b, 146d of FIG. 1A remain, in the embodiments of FIG. 3A.

While not illustrated, other combinations of one or more ring-shaped segments may be omitted from the seal-ring structure 102 of FIG. 1A in other embodiments. For example, the first ring-shaped segment 146a of FIG. 1A may be omitted, while the second, third, and fourth ring-shaped segments 146b, 146c, 146d of FIG. 1A remain. As another example, the second and fourth ring-shaped segments 146b, 146d of FIG. 1A may be omitted, while the first and third ring-shaped segments 146a, 146c remain.

As illustrated by the cross-sectional view 300B of FIG. 3B, the seal-ring structure 102 of FIG. 1A includes one or more additional ring-shaped segments. In particular, the seal-ring structure 102 includes first, second, third, and fourth ring-shaped segments 146a, 146b, 146c, 146d, and further includes a fifth ring-shaped segment 146e, in the embodiments of FIG. 3B.

Figure 4A:
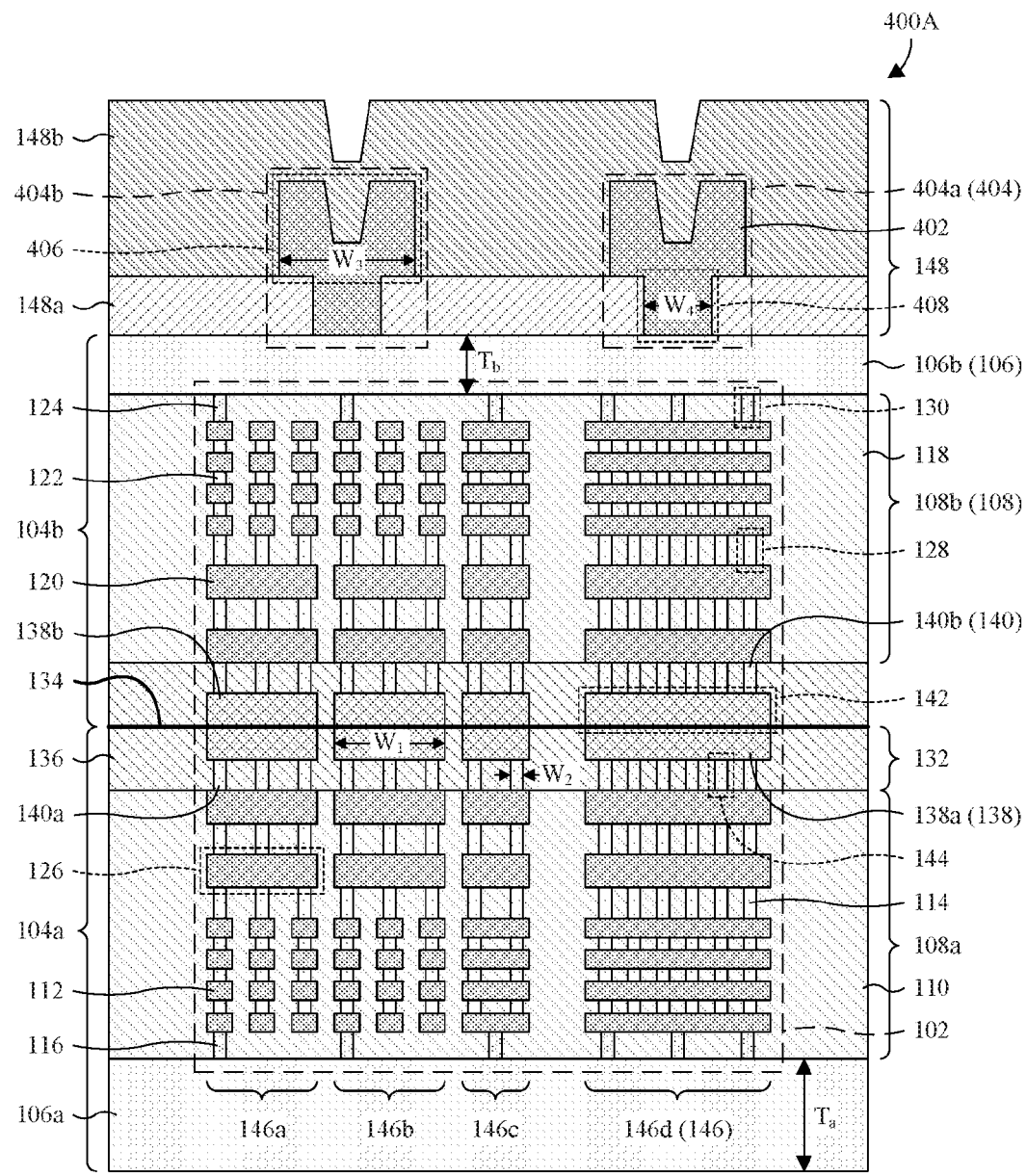
FIGS. 4A-4C illustrate cross-sectional views of other embodiments of the 3D IC die of FIG. 1A in which pad structures are arranged directly over the seal-ring structure.
Figure 4B:
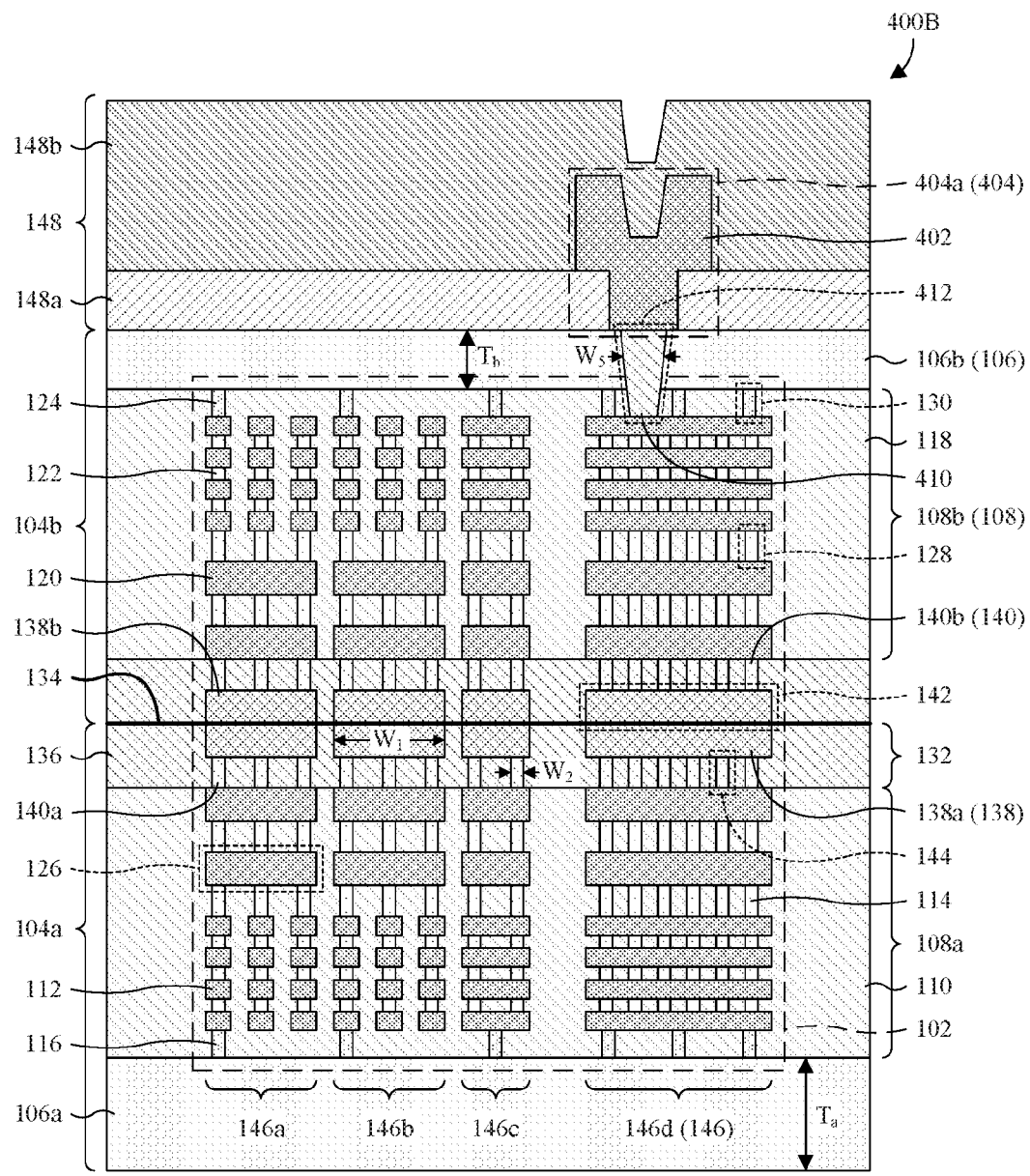
Figure 4C:
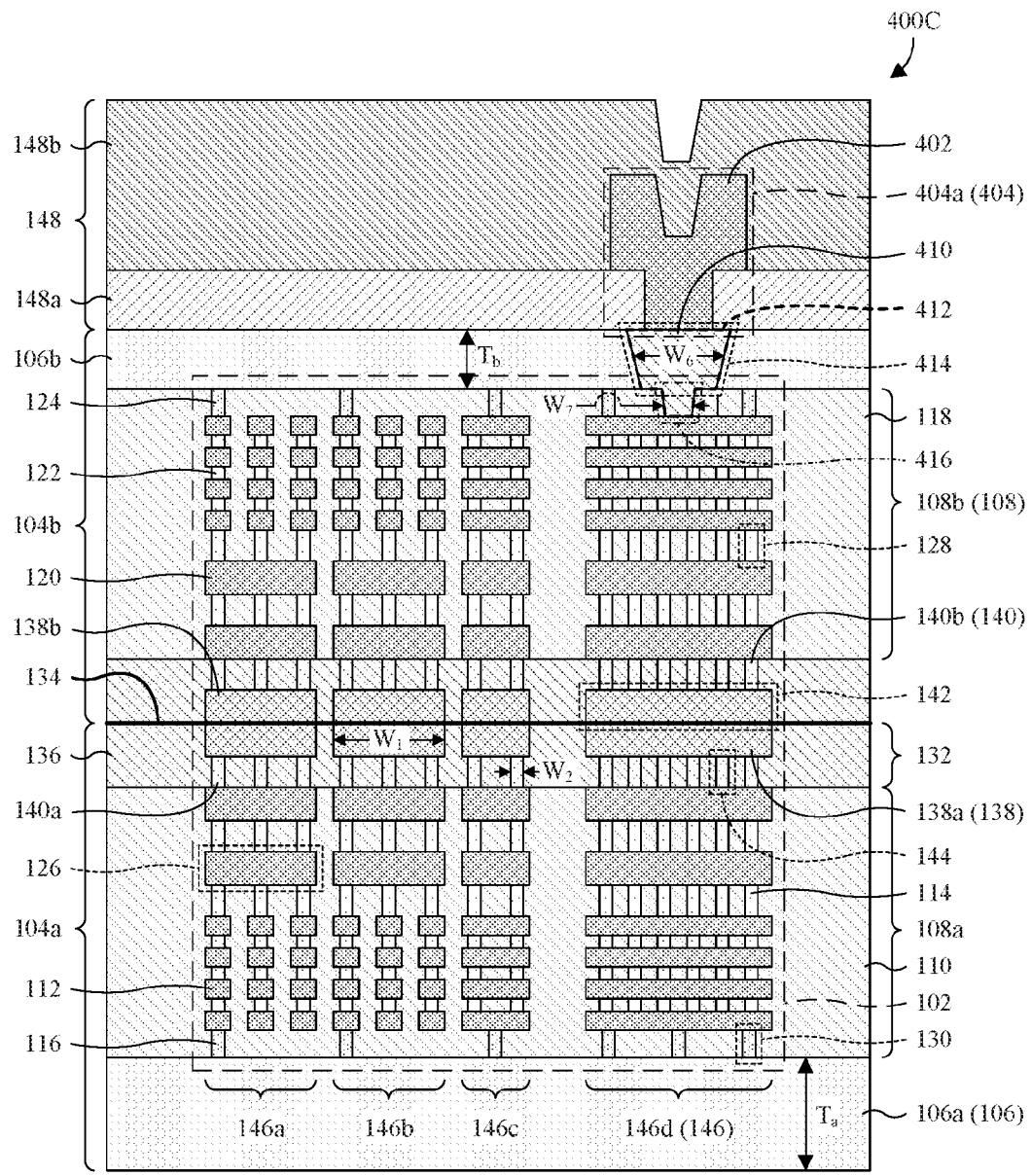

With reference to FIGS. 4A-4C, cross-sectional views 400A-400C of other embodiments of the 3D IC die of FIG. 1A are provided in which pad structures are arranged directly over the seal-ring structure. These embodiments may, for example, also be combined with the embodiments of FIGS. 2A-2D and/or the embodiments of FIGS. 3A and 3B.

As illustrated by the cross-sectional view 400A of FIG. 4A, the passivation layer 148 comprises a first passivation sublayer 148a and a second passivation sublayer 148b overlying the first passivation sublayer 148a, and further comprises a pad layer 402 between the first and second passivation sublayers 148a, 148b. The first and second passivation sublayers 148a, 148b are dielectric and may be, for example, silicon dioxide, silicon nitride, silicon oxynitride, silicon carbide, some other dielectric, or a combination of the foregoing. Further, the first and second passivation sublayers 148a, 148b may be the same material or different materials.

The pad layer 402 comprises one or more pad structures 404 directly over the seal-ring structure 102. For example, the pad layer 402 may comprise a first pad structure 404a and a second pad structure 404b directly over the seal-ring structure 102. The pad structure(s) 404 each comprise a pad regions 406 and a via region 408. The pad region(s) 406 is/are over the first passivation sublayer 148a and are at least partially covered by the second passivation sublayer 148b. While not illustrated, in some embodiments, the second passivation sublayer 148b has one or more openings over and respectively exposing the pad region(s) 406. The via region(s) 408 is/are in the first passivation sublayer 148a and, in some embodiments, contact the second semiconductor substrate 106b. Further, each of the via region(s) 408 has a top boundary demarcated by a top surface of the first passivation sublayer 148a and extends through the first passivation sublayer 148a.

The pad region(s) 406 and the via region(s) 408 are conductive and may be, for example, copper, aluminum, aluminum copper, tungsten, some other conductor, or a combination of the foregoing. In some embodiments, the pad region(s) 406 is/are integrated with, and/or the same material as, the via region(s) 408. In other embodiments, the pad region(s) 406 is/are distinct from, and/or a different material than, the via region(s) 408. Further, in some embodiments, each of the pad region(s) 406 has a third width $W_3$, and each of the via region(s) 408 has a fourth width $W_4$ less than the third width $W_3$. The third width $W_3$ may be, for example, between about 3-5 micrometers, such as about 3.6 micrometers, and/or the fourth width $W_4$ may be, for example, between about 1-2 micrometers, such as about 1.8 micrometers.

Advantageously, by arranging the pad structure(s) 404 directly over the seal-ring structure 102, and further arranging additional pad structures directly over the 3D IC, top usage of the 3D IC die is high and the 3D IC die may have a small footprint. For example, suppose the 3D IC is dependent upon a set number of pad structures, and further suppose the top surface area of the 3D IC die directly over the 3D IC is insufficient to accommodate the set number of pad structures. In this example, by further using the top surface area of the 3D IC die directly over the seal-ring structure 102, there may be sufficient top surface area to accommodate the set of pad structures without enlarging a footprint of the 3D IC die.

As illustrated by the cross-sectional view 400B of FIG. 4B, a backside through substrate via (BTSV) layer 410 is between the first passivation sublayer 148a and the second interconnect structure 108b. Further, the BTSV layer 410 extends through the second semiconductor substrate 106b and comprises a BTSV 412. The BTSV layer 410 is conductive and may be, for example, copper, aluminum, aluminum copper, tungsten, some other conductor, or a combination of the foregoing.

The BTSV 412 is directly over the seal-ring structure 102, laterally between device contacts in the second device contact layer 124. Further, the BTSV 412 extends through the second semiconductor substrate 106b, from the first pad structure 404a to a second wiring layer nearest the second semiconductor substrate 106b, thereby electrically coupling the first pad structure 404a to the second interconnect structure 108b. Further, the BTSV 412 has sidewalls that extend continuously from the first pad structure 404a to the second wiring layer, and further has a fifth width $W_5$ (e.g., a top or maximum width). The fifth width $W_5$ is less than widths of the pad structure(s) 404, such as the third and fourth widths $W_3$, $W_4$ shown in FIG. 4B. Further, the fifth width $W_5$ may be, for example, less than about 2 micrometers, such as about 1.5 micrometers.

As illustrated by the cross-sectional view 400C of FIG. 4C, a variant is FIG. 4B is provided in which the BTSV 412 discretely tapers, such that sidewalls of the BTSV 412 are discontinuous from the first pad structure 404a to the second device contact layer 124. The BTSV 412 comprises a backside semiconductor region 414 in the second semiconductor substrate 106b, and extending from a top surface of the second semiconductor substrate 106b, through the second semiconductor substrate 106b, to a bottom surface of the second semiconductor substrate 106b. Further, the BTSV 412 comprises a backside contact region 416 in the second ILD layer 118, and extending from the bottom surface of the second semiconductor substrate 106b to a second wiring layer nearest the second semiconductor substrate 106b.

The backside semiconductor region 414 and the backside contact region 416 are conductive and may be, for example, copper, aluminum, aluminum copper, tungsten, some other conductor, or a combination of the foregoing. In some embodiments, the backside semiconductor region 414 is integrated with, and/or the same material as, the backside contact region 416. In other embodiments, the backside semiconductor region 414 is distinct from, and/or a different material than, the backside contact region 416. Further, the backside semiconductor region 414 has a sixth width $W_6$ and the backside contact region 416 has a seventh width $W_7$ less than the sixth width $W_6$. The sixth width $W_6$ may be, for example, 3-5 micrometers, such as about 3.4 micrometers. The seventh width $W_7$ may be, for example, 1-3 micrometers, such as about 2.4 micrometers.

While a single BTSV/pad structure pair is illustrated in FIGS. 4B and 4C, it is to be understand that one or more additional BTSV/pad structure pairs may be arranged directly over the seal-ring structure 102 and individually configured as described in FIG. 4B or 4C. For example, additional BTSV/pad structure pairs may be laterally spaced and arranged in a ring directly over the seal-ring structure 102.

Figure 5:
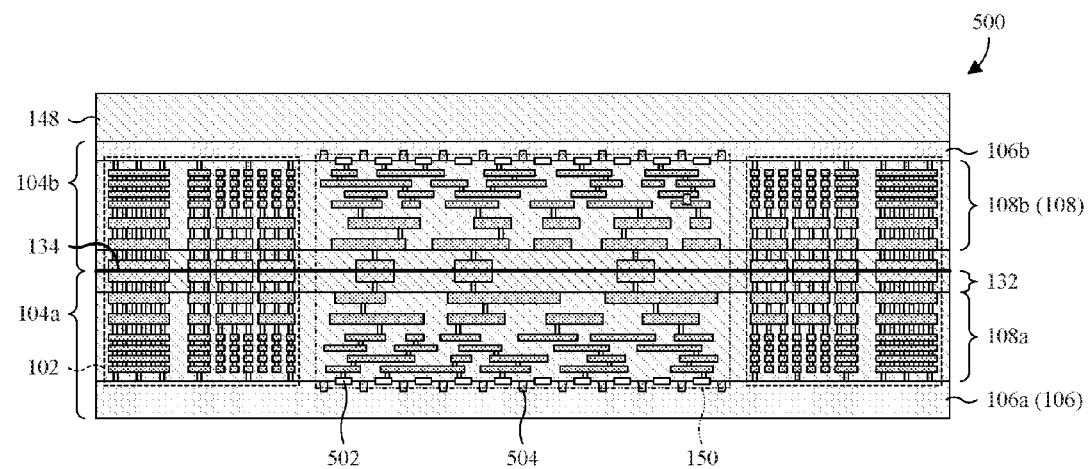
FIG. 5 illustrates a cross-sectional view of some more detailed embodiments of the 3D IC die of FIG. 1A in which a 3D IC is shown enclosed by the seal-ring structure.

With reference to FIG. 5, a cross-sectional view 500 of some more detailed embodiments of the 3D IC die of FIG. 1A is provided in which the 3D IC 150 is shown enclosed by the seal-ring structure 102. These embodiments may, for example, also be combined with the embodiments of FIGS. 2A-2D, the embodiments of FIGS. 3A and 3B, the embodiments of FIGS. 4A-4C, or a combination of the foregoing.

As illustrated, the 3D IC 150 comprises one or more semiconductor devices 502 distributed between the semiconductor substrates 106, and electrically coupled to one another with conductive paths defined by the interconnect structures 108 and the HB structures 132. The semiconductor devices 502 may be, for example, MOSFETs, IGFETS, MIM capacitors, flash memory cells, or the like. Further, in some embodiments, isolation regions 504 are arranged in the semiconductor substrates 106 to provide electrical isolation between the semiconductor devices 502. The isolation regions 504 may be, for example, shallow trench isolation (STI) regions or deep trench isolation (DTI) regions.

Figure 11:
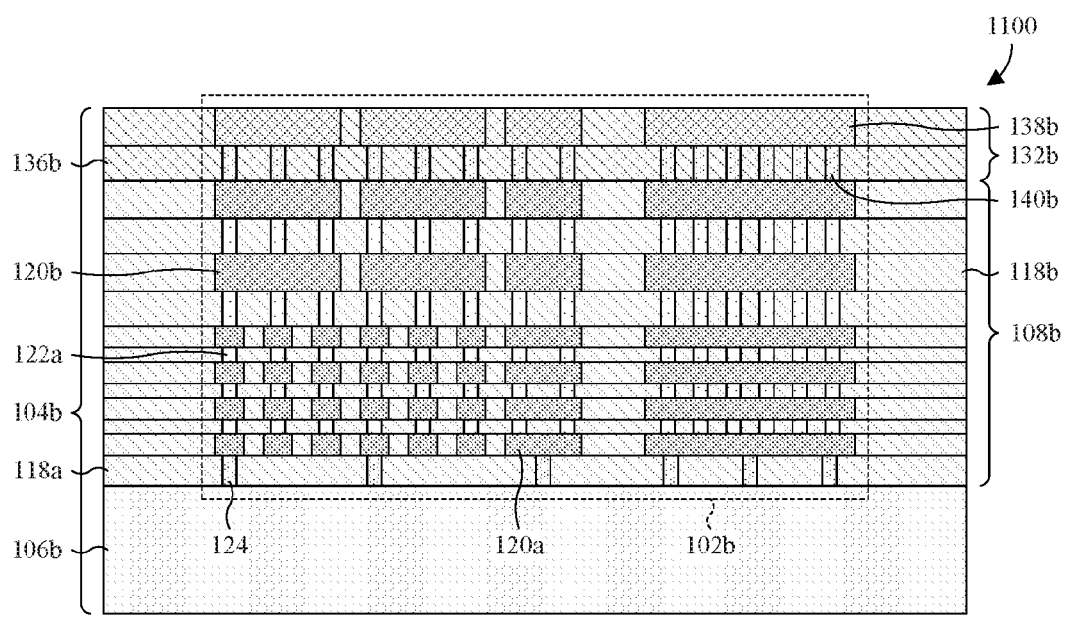
Figure 12:
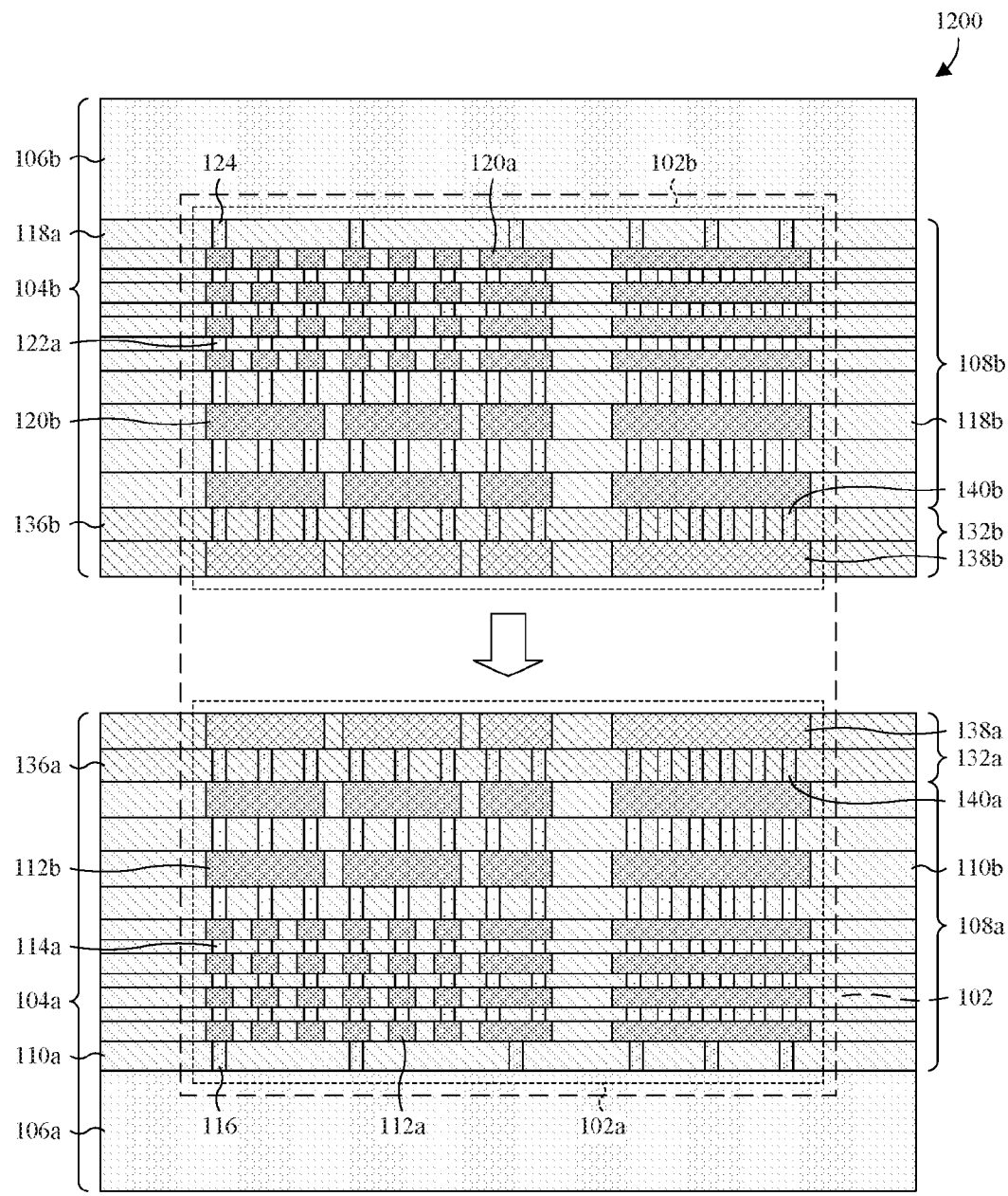

With reference to FIGS. 6-13, 14A-14C, 15A-15C, and 16A-16D, a series of cross-sectional views 600-1300, 1400A-1400C, 1500A-1500C, 1600A-1600D illustrate some embodiments of a method for manufacturing a 3D IC die with a seal-ring structure 102 (see, e.g., FIG. 12). The 3D IC die comprises a first IC die 104a and a second IC die 104b (see, e.g., FIG. 11) arranged over and hybrid bonded to the first IC die 104a. Further, the seal-ring structure 102 is made up of a first seal-ring substructure 102a (see e.g., FIG. 7) in the first IC die 104a and a second seal-ring substructure 102b (see, e.g., FIG. 11) in the second IC die 104b.

As illustrated by the cross-sectional views 600-1000 of FIGS. 6-10, the first IC die 104a is formed with the first seal-ring structure 102a. In particular, as illustrated by the cross-sectional view 600 of FIG. 6, a pair of first ILD layers 110a is formed over a first semiconductor substrate 106a. For example, a lower layer of the first ILD layers 110a is formed covering the first semiconductor substrate 106a, and an upper layer of the first ILD layers 110a is subsequently formed covering the lower layer. The first ILD layers 110a are formed stacked and may, for example, be formed by vapor deposition (e.g., chemical or physical vapor deposition), atomic layer deposition, thermal oxidation, some other growth or deposition process, or a combination of the foregoing. Further, the first ILD layers 110a may be formed of, for example, silicon dioxide, a low κ dielectric, some other dielectric, or the like.

In some embodiments, an etch stop layer (not shown) is formed between the first ILD layers 110a. The etch stop layer is a different material than the first ILD layers 110a and may be, for example, silicon nitride. Further, in some embodiments, the first ILD layers 110a are integrated together and/or are the same material. For example, the first ILD layers 110a may be different regions of the same deposition or growth.

Figure 7:
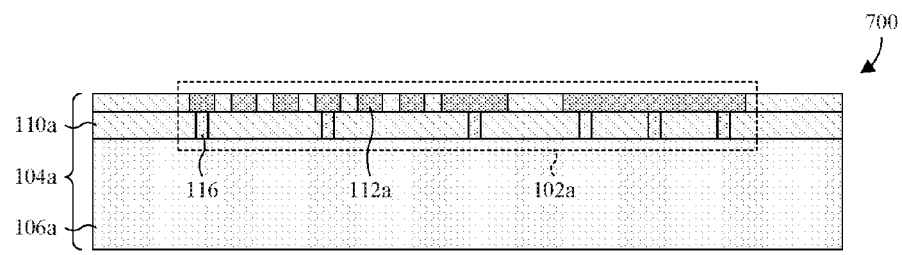

As illustrated by the cross-sectional view 700 of FIG. 7, a first wiring layer 112a and a first device contact layer 116 are formed respectively in the first ILD layers 110a. For example, the first wiring layer 112a may be formed sunken into an upper layer of the first ILD layers 110a, and the first device contact layer 116 may be formed extending from the first wiring layer 112a, through the lower layer of the first ILD layers 110a, to the first semiconductor substrate 106a. Further, the first wiring layer 112a and the first device contact layer 116 are formed with a pattern of the first seal-ring substructure 102a.

In some embodiments, the process for forming the first wiring layer 112a and the first device contact layer 116 comprises performing a first selective etch into the upper layer of the first ILD layers 110a to form first openings in the upper layer with a pattern of the first wiring layer 112a. The first selective etch may stop, for example, on an etch stop layer between the first ILD layers 110a. Thereafter, a second selective etch is performed into the lower layer of the first ILD layers 110a to form second openings in the lower layer with a pattern of the first device contact layer 116. A conductive layer is formed filling the first and second openings, and a planarization is performed to coplanarize an upper or top surface of conductive layer with an upper or top surface of the upper layer, whereby the first wiring layer 112a and the first device contact layer 116 are formed from the conductive layer. The first and second selective etches may be performed selectively by, for example, photolithography, and/or the planarization may be performed by, for example, chemical mechanical polish (CMP).

Figure 6:
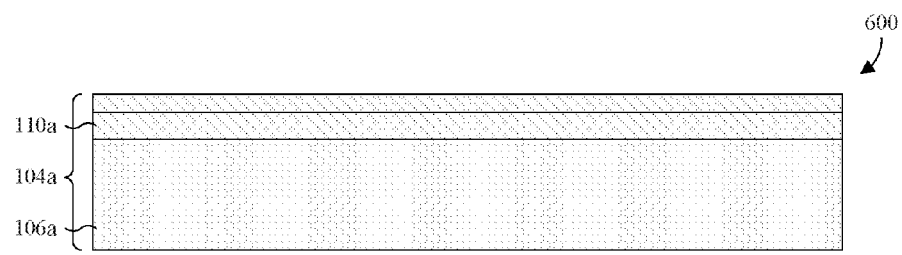
FIGS. 6-13, 14A-14C, 15A-15C, and 16A-16D illustrate a series of cross-sectional views of some embodiments of a method for manufacturing a 3D IC die with a seal-ring structure.

While the acts of FIGS. 6 and 7 illustrate and describe a dual-damascene-like process for forming the first wiring layer 112a and the first device contact layer 116, a single-damascene-like process may alternatively be employed to form the first wiring layer 112a and the first device contact layer 116 in other embodiments. A dual-damascene-like process and a single-damascene-like process are respectively dual-damascene and single-damascene processes that are not restricted to copper.

Figure 8:
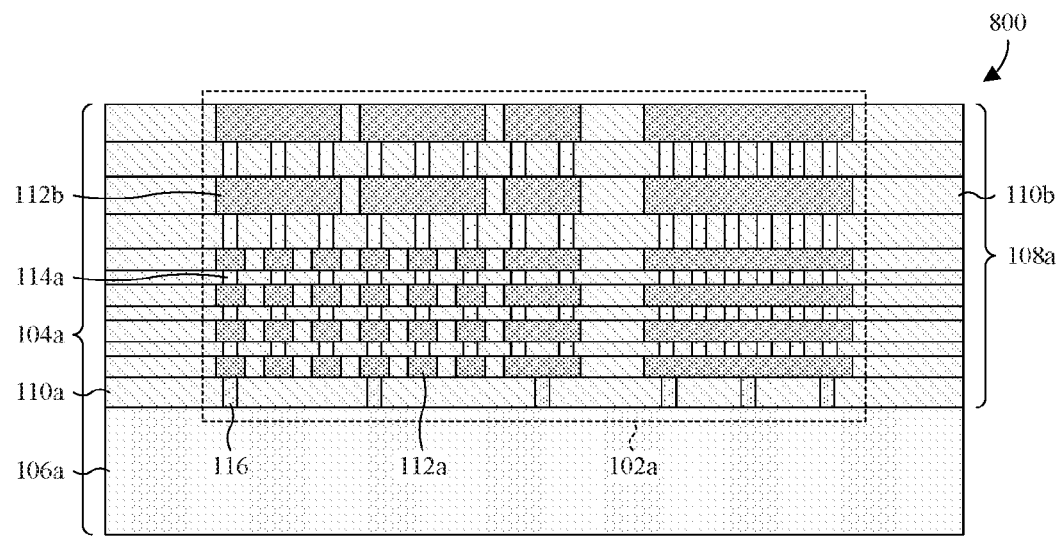

As illustrated by the cross-sectional view 800 of FIG. 8, the acts of FIGS. 6 and 7 are repeated one or more times. As such, one or more additional pairs of first ILD layers 110b are formed stacked over the first semiconductor substrate 106a, each accommodating an additional first wiring layer 112b and a first inter-wire via layer 114a. Collectively, the first ILD layers 110a, 110b, the first wiring layers 112a, 112b, the first device contact layer 116, and the one or more first inter-wire via layers 114a define a first interconnect structure 108a.

Figure 9:
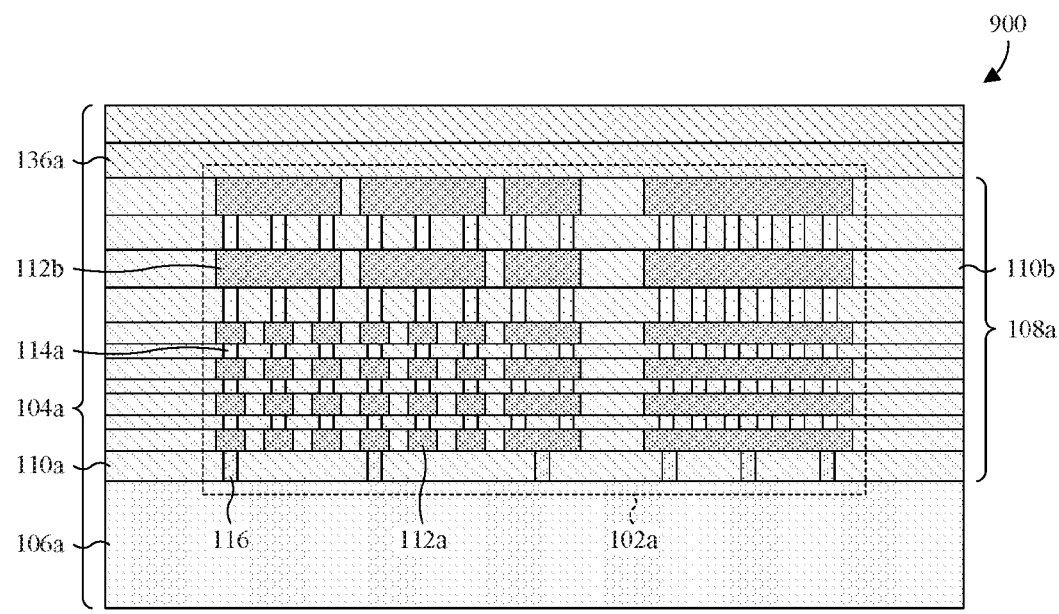

As illustrated by the cross-sectional view 900 of FIG. 9, a pair of first HB dielectric layers 136a is formed over the first interconnect structure 108a. For example, a lower layer of the first HB dielectric layers 136a is formed covering the first interconnect structure 108a, and an upper layer of the first HB dielectric layers 136a is subsequently formed covering the lower layer. The first HB dielectric layers 136a may be formed, for example, in the same manner or a similar manner as described for the first ILD layers 110a in FIG. 6.

In some embodiments, an etch stop layer (not shown) is formed between the first HB dielectric layers 136a. The etch stop layer is a different material than the first HB dielectric layers 136a and may be, for example, silicon nitride. Further, in some embodiments, the first HB dielectric layers 136a are integrated together and/or are the same material. For example, the first HB dielectric layers 136a may be different regions of the same deposition or growth.

Figure 10:
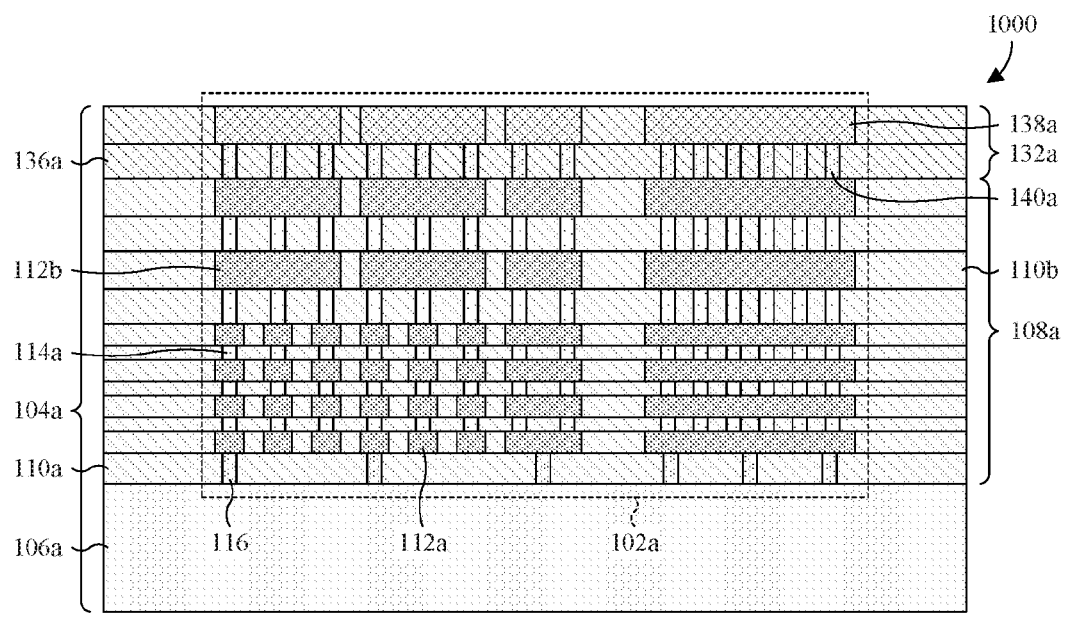

As illustrated by the cross-sectional view 1000 of FIG. 10, a first HB link layer 138a and a first HB contact layer 140a are formed respectively in the first HB dielectric layers 136a. For example, the first HB link layer 138a may be formed sunken into an upper layer of the first HB dielectric layers 136a, and the first HB contact layer 140a may be formed extending from the first HB link layer 138a, through the lower layer of the first HB dielectric layers 136a, to the first interconnect structure 108a. Further, the first HB link layer 138a and the first HB contact layer 140a are formed with a pattern of the first seal-ring substructure 102a. Collectively, the first HB dielectric layers 136a, the first HB link layer 138a, and the first HB contact layer 140a define a first HB structure 132a.

In some embodiments, the process for forming the first HB link layer 138a and the first HB contact layer 140a is performed in the same manner or a similar manner as described for the first wiring layer 112a and the first device contact layer 116 in FIG. 7. Further, while the acts of FIGS. 9 and 10 illustrate and describe a dual-damascene-like process for forming the first HB link layer 138a and the first HB contact layer 140a, a single-damascene-like process may alternatively be employed to form the first HB link layer 138a and the first HB contact layer 140a in other embodiments.

As illustrated by the cross-sectional view 1100 of FIG. 11, the second IC die 104b is formed with the second seal-ring substructure 102b. The second IC die 104b is formed in the same manner or a similar manner as described for the first IC die 104a in FIGS. 6-10. As such, the second IC die 104b comprises a second interconnect structure 108b over a second semiconductor substrate 106b, and further comprises a second HB structure 132b over the second interconnect structure 108b. The second interconnect structure 108b comprises a pair of second ILD layers 118a, as well as a second wiring layer 120a and a second device contact layer 124 respectively in the second ILD layers 118a. Further, the second interconnect structure 108b comprises one or more additional pairs of second ILD layers 118b stacked over the second semiconductor substrate 106b, each accommodating an additional second wiring layer 120b and a second inter-wire via layer 122a. The second HB structure 132b comprises a pair of second HB dielectric layers 136b, as well as a second HB link layer 138b and a second HB contact layer 140b respectively in the second HB dielectric layers 136b.

As illustrated by the cross-sectional view 1200 of FIG. 12, the second IC die 104b is flipped and bonded to the first IC die 104a, such that the first and second HB structures 132a, 132b interface to define a HB. The HB comprises a dielectric-to-dielectric bond between the first and second HB dielectric layers 136a, 136b. Further, the HB comprises a conductor-to-conductor bond between the first and second HB link layers 138a, 138b. Collectively, the first and second seal-ring substructures 102a, 102b define the seal-ring structure 102. The process for bonding the second IC die 104b to the first IC die 104a may comprise, for example, fusion bonding processes and/or metallic bonding processes.

Figure 13:
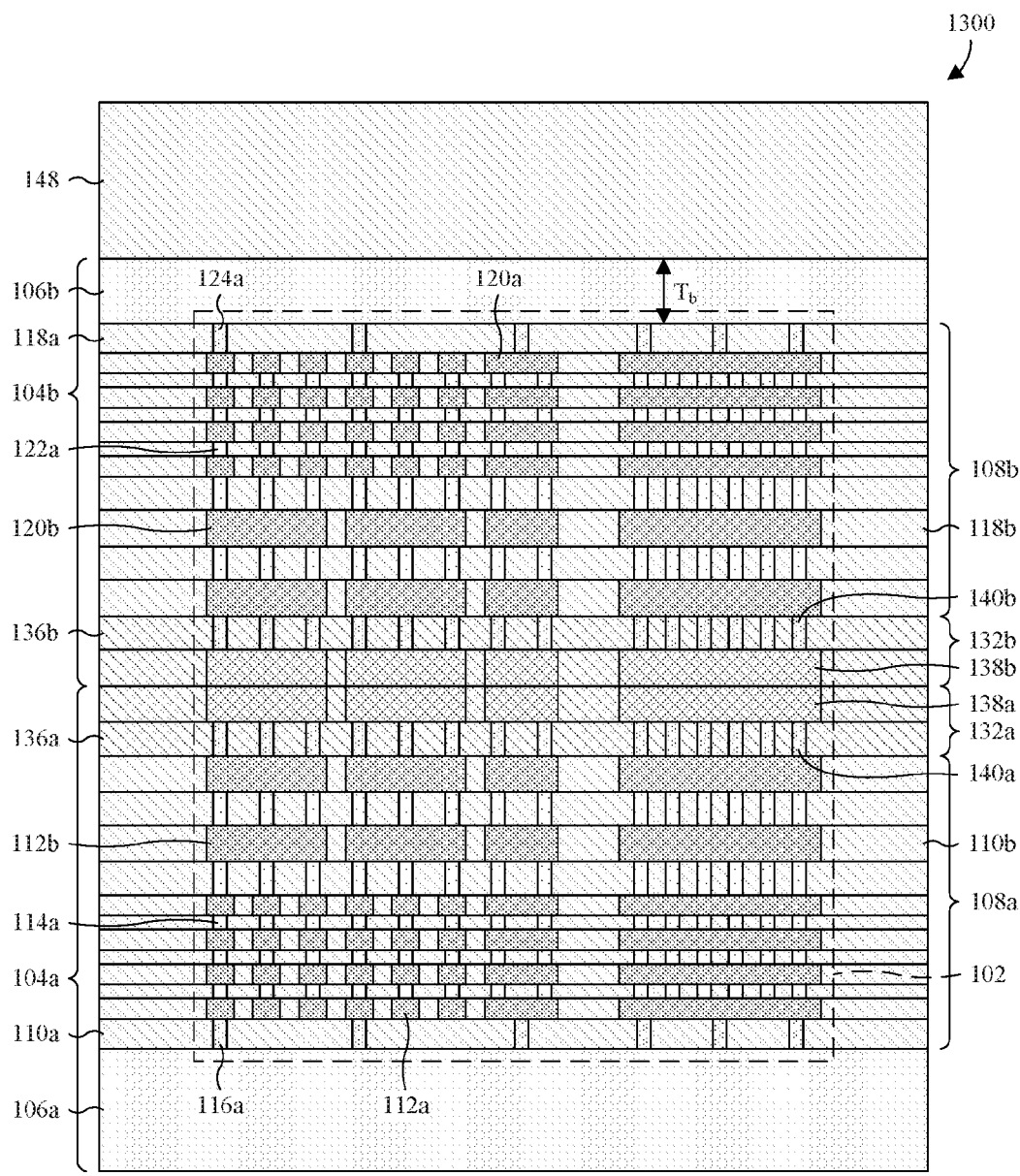

As illustrated by the cross-sectional view 1300 of FIG. 13, a planarization is performed into the second semiconductor substrate 106b to thin the second semiconductor substrate 106b to a thickness $T_b$. The planarization may be performed by, for example, a CMP and/or an etch back.

Also illustrated by the cross-sectional view 1300 of FIG. 13, a passivation layer 148 is formed covering the second IC die 104. The passivation layer 148 may, for example, be formed by vapor deposition (e.g., chemical or physical vapor deposition), atomic layer deposition, thermal oxidation, some other growth or deposition process, or a combination of the foregoing. Further, the passivation layer 148 may be formed of, for example, silicon dioxide, silicon nitride, some other dielectric, a combination of the foregoing, or the like.

Figure 14A:
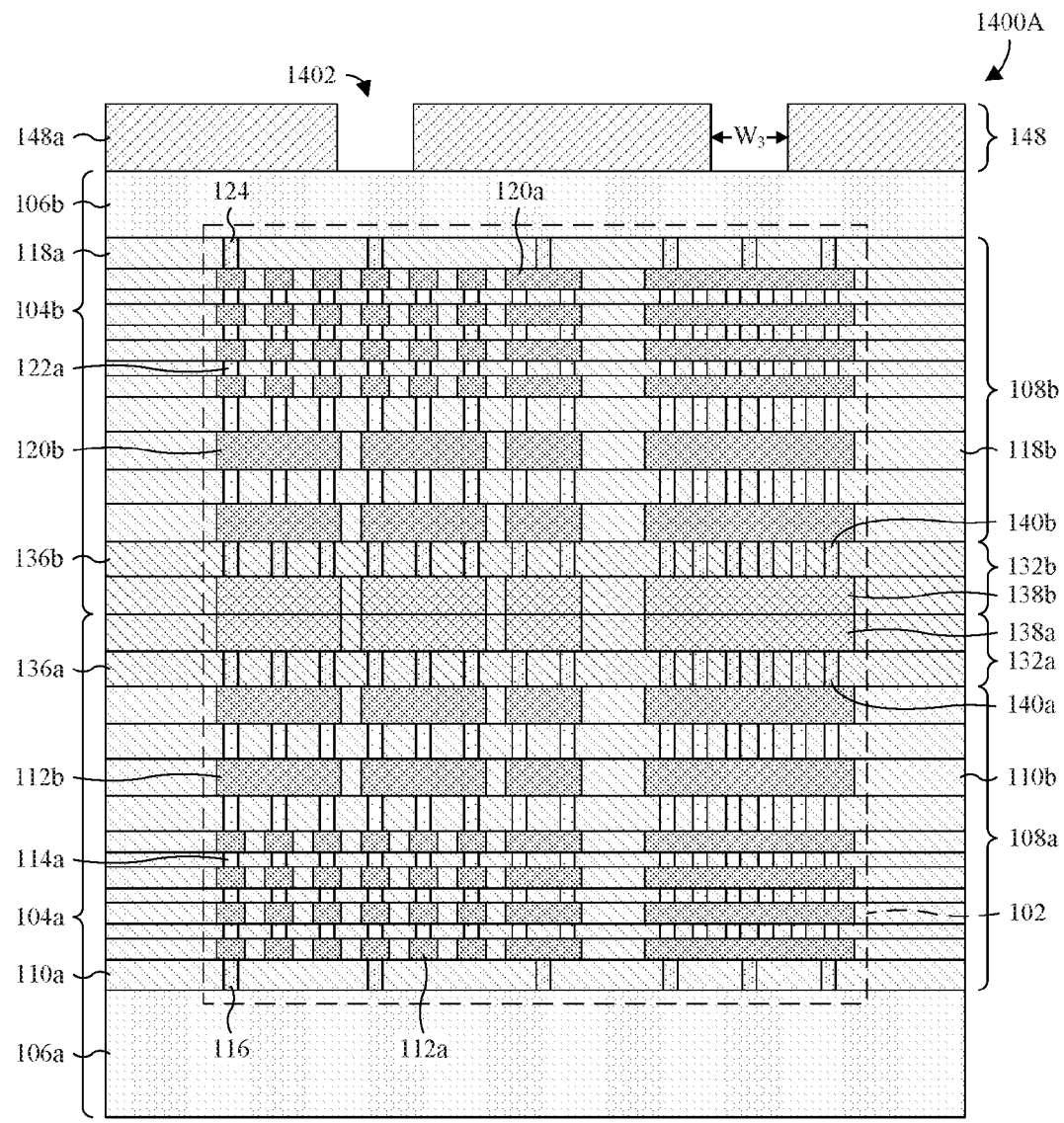
Figure 14B:
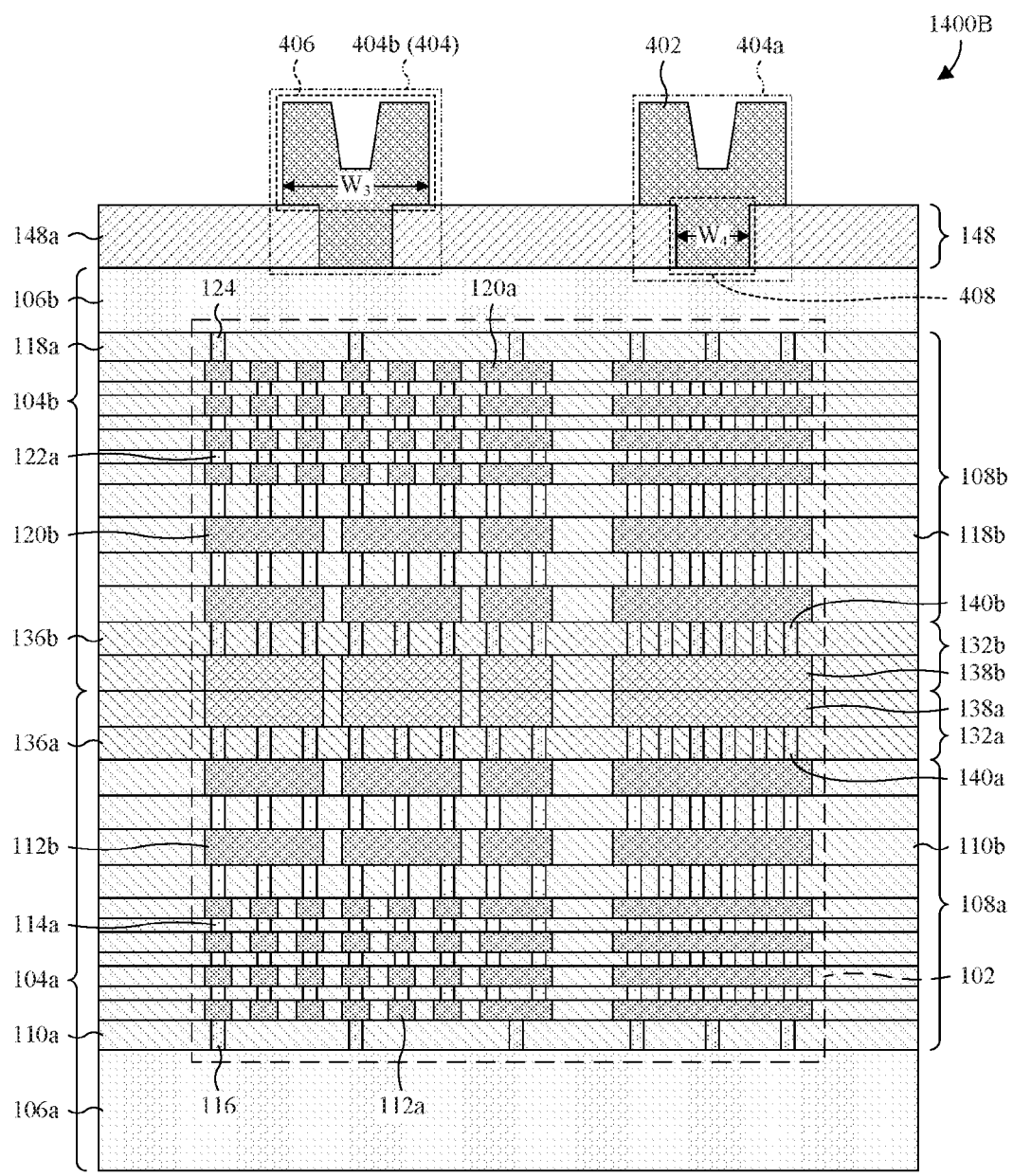
Figure 14C:
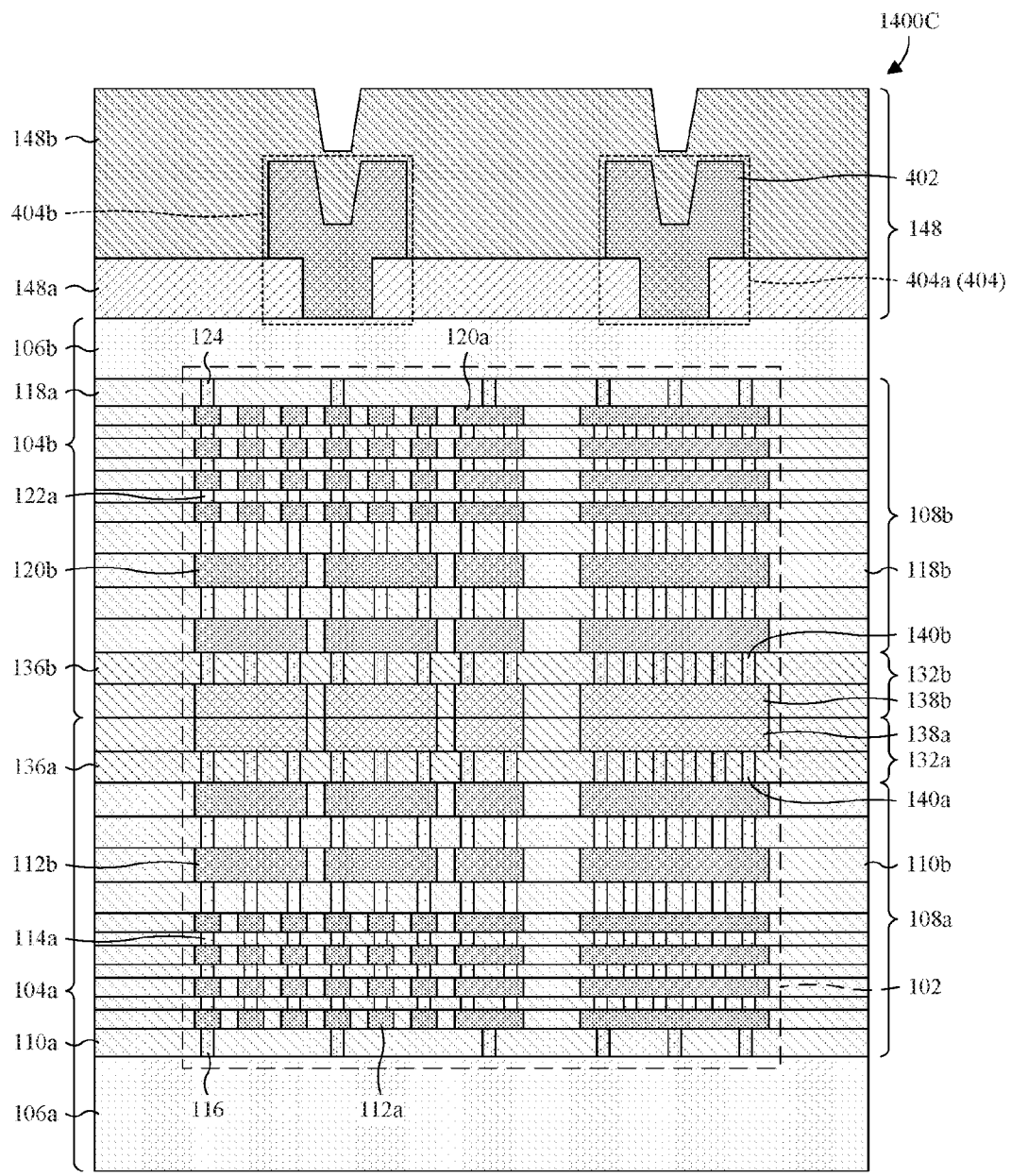

As illustrated by the cross-sectional views 1400A-1400C of FIGS. 14A-14C, in some embodiments, one or more pad structures 404 (see, e.g., FIGS. 14B and 14C) are formed in the passivation layer 148. In particular, as illustrated by the cross-sectional view 1400A of FIG. 14A, a first passivation sublayer 148a of the passivation layer 148 is formed covering the second IC die 104b after performing the planarization into the second semiconductor substrate 106b. The first passivation sublayer 148a may, for example, be formed by vapor deposition (e.g., chemical or physical vapor deposition), atomic layer deposition, thermal oxidation, some other growth or deposition process, or a combination of the foregoing. Further, the first passivation sublayer 148a may be formed of, for example, silicon dioxide, silicon nitride, some other dielectric, a combination of the foregoing, or the like.

Also illustrated by the cross-sectional view 1400A of FIG. 14A, a selective etch is performed into the first passivation sublayer 148a to form one or more pad openings 1402 directly over the seal-ring structure 102. The pad opening(s) 1402 correspond to the pad structure(s) 404 (see, e.g., FIGS. 14B and 14C) and extend through the first passivation sublayer 148a to a backside of the second semiconductor substrate 106b. Further, the pad opening(s) 1402 each have a width $W_3$ that may be, for example, about 1-3 micrometers. The selective etch may be performed selectively by, for example, photolithography.

As illustrated by the cross-sectional view 1400B of FIG. 14B, a pad layer 402 is formed filling the pad opening(s) 1402 and covering the first passivation sublayer 148a. The pad layer 402 may, for example, be formed by vapor deposition, atomic layer deposition, electrochemical plating, some other growth or deposition process, or a combination of the foregoing. Further, the pad layer 402 is conductive and may be formed of, for example, aluminum, copper, aluminum copper, some other conductive material, a combination of the foregoing, or the like.

Also illustrated by the cross-sectional view 1400B of FIG. 14B, a selective etch is performed into the pad layer 402 to define the pad structure(s) 404 directly over the seal-ring structure 102. For example, the selective etch may define a first pad structure 404a and a second pad structure 404b. The selective etch may be performed selectively by, for example, photolithography. The pad structure(s) 404 each comprise a pad region 406 over the first passivation sublayer 148a, and each comprise a via region 408 filling a corresponding one of the pad opening(s) 1402 (see, e.g., FIG. 14A). The pad region 406 has a width $W_3$ that may be, for example, about 3-5 micrometers, and the via region 408 has the same width $W_4$ as the pad opening(s) 1402.

While not illustrated, in alternative embodiments, a planarization (e.g., a CMP) may be performed into the pad layer 402 to coplanarize an upper or top surface of the pad layer 402 with an upper or top surface of the first passivation sublayer 148a, and to form the via region(s) 408. Thereafter, another pad layer (not shown) may be formed over the pad layer 402 and the first passivation sublayer 148a, and subsequently patterned by selective etching to define the pad region(s) 406. The other pad layer is conductive and may be, for example, the same material or a different material as the pad layer 402.

As illustrated by the cross-sectional view 1400C of FIG. 14C, a second passivation sublayer 148b of the passivation layer 148 is formed covering the first passivation sublayer 148a and the pad layer 402. The second passivation sublayer 148b may, for example, be formed by vapor deposition (e.g., chemical or physical vapor deposition), atomic layer deposition, thermal oxidation, some other growth or deposition process, or a combination of the foregoing. Further, the second passivation sublayer 148b may be formed of, for example, silicon dioxide, silicon nitride, some other dielectric, a combination of the foregoing, or the like.

Figure 15A:
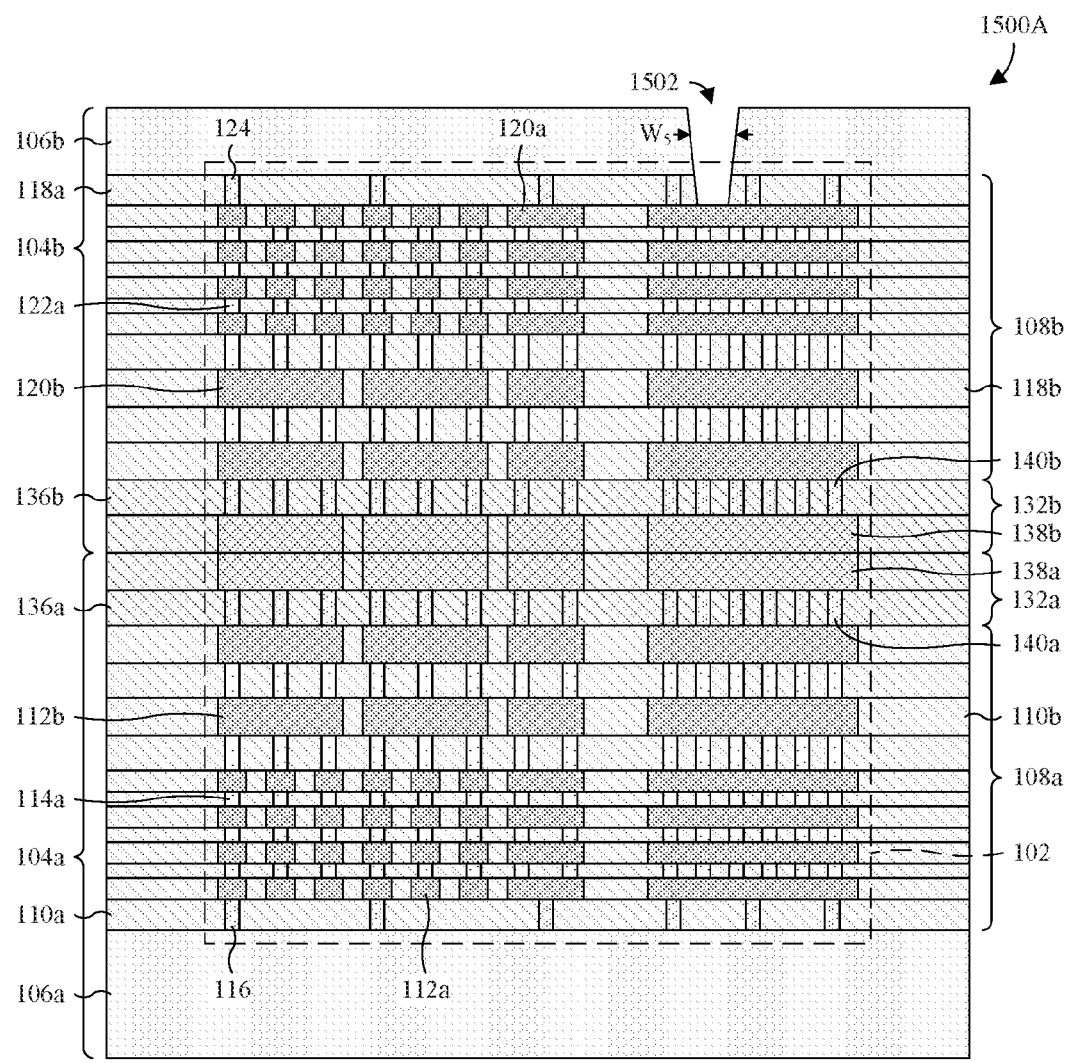
Figure 15B:
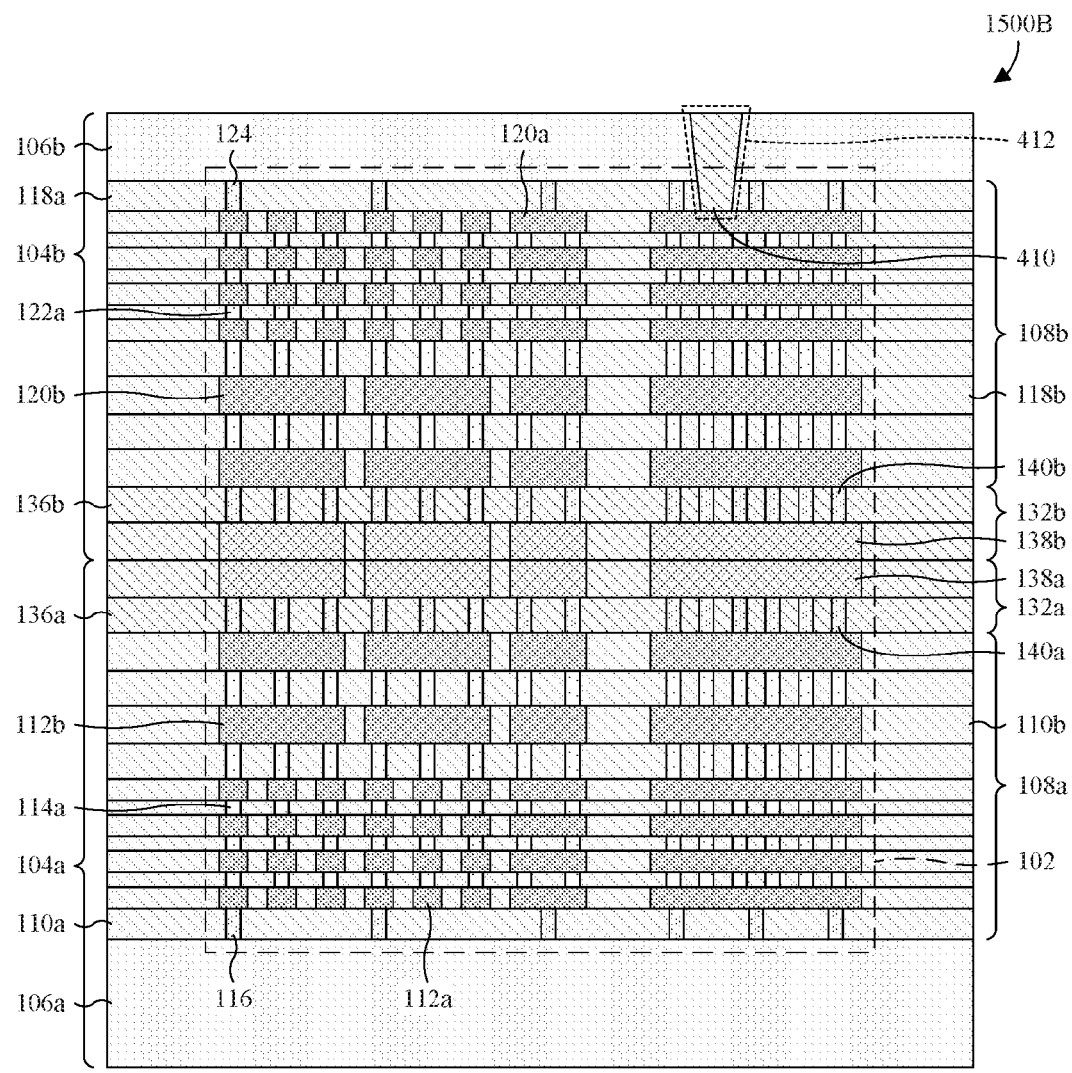
Figure 15C:
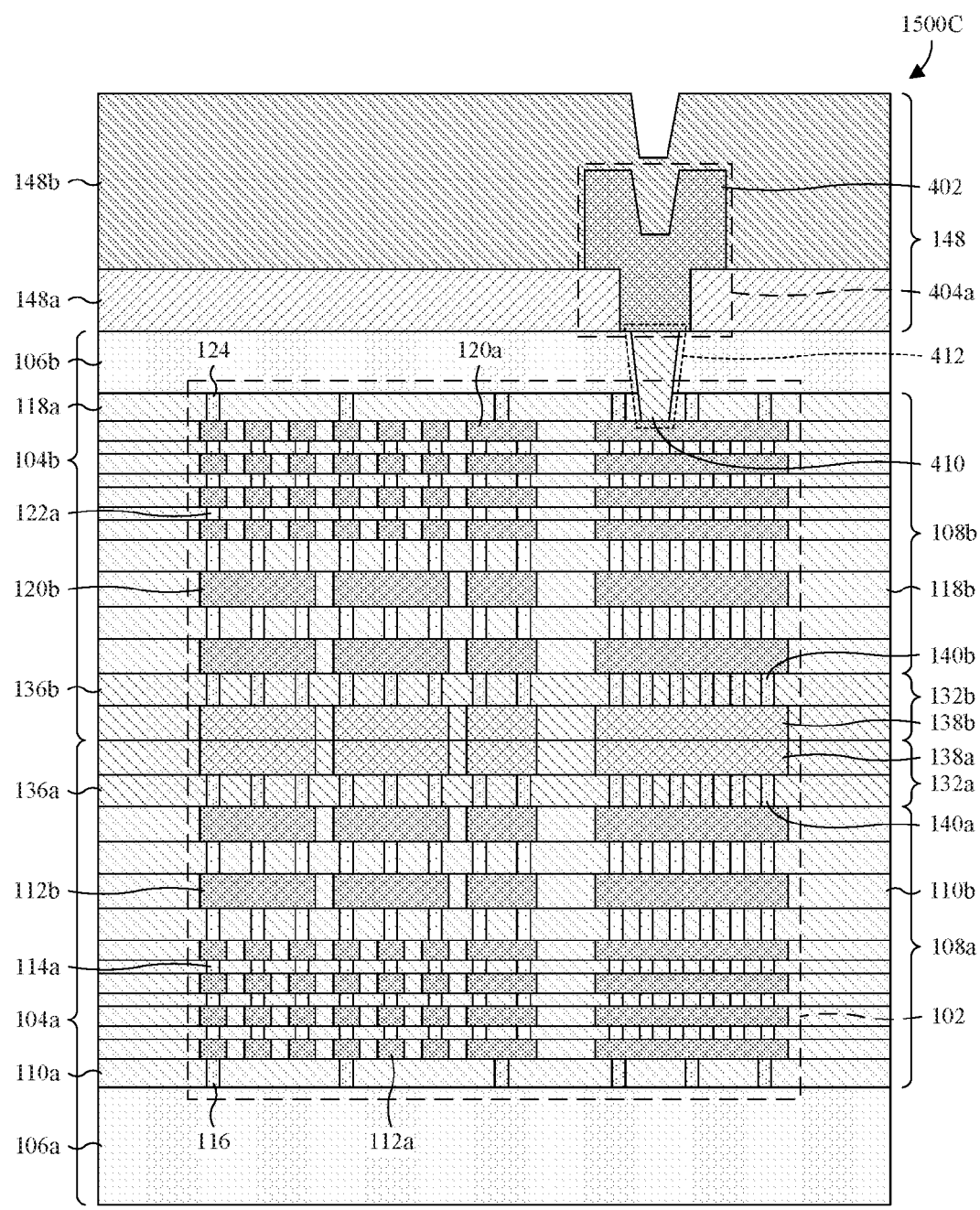

As illustrated by the cross-sectional views 1500A-1500C of FIGS. 15A-15C, in some embodiments, a BTSV (see, e.g., FIGS. 15B and 15C) is formed extending through the second semiconductor substrate 106b. In particular, as illustrated by the cross-sectional view 1500A of FIG. 15A, a selective etch is performed into the second semiconductor substrate 106b and the second ILD layer 118a to form a BTSV opening 1502. The BTSV opening 1502 is formed directly over the seal-ring structure 102 and laterally between a neighboring pair of device contacts in the second device contact layer 124. Further, the BTSV opening 1502 is formed extending to a second wiring layer 120a nearest the second semiconductor substrate 106b, thereby exposing the second wiring layer 120a. The BTSV opening 1502 has a width $W_5$ that may be, for example, about 1-3 micrometers, such as less than about 2 micrometers. The selective etch may be performed selectively by, for example, photolithography.

As illustrated by the cross-sectional view 1500B of FIG. 15B, a BTSV layer 410 is formed with a BTSV 412 filling the BTSV opening 1502 (see, e.g., FIG. 15A). The BTSV layer 410 is conductive and may be formed of, for example, aluminum, copper, aluminum copper, some other conductive material, a combination of the foregoing, or the like.

In some embodiments, the process for forming the BTSV layer 410 comprises forming the BTSV layer 410 filling the BTSV opening 1502 and covering the second semiconductor substrate 106b. The BTSV layer 410 may, for example, be formed by vapor deposition, atomic layer deposition, electrochemical planting, some other growth or deposition process, or a combination of the foregoing. Thereafter, a planarization is performed into the BTSV layer 410 to coplanarize an upper or top surface of the BTSV layer 410 with an upper or top surface of the second semiconductor substrate 106b, thereby forming the BTSV 412. The planarization may be performed by, for example, CMP.

As illustrated by the cross-sectional view 1500C of FIG. 15C, a passivation layer 148 is formed covering the second semiconductor substrate 106b and the BTSV layer 410. The passivation layer 148 comprises a first passivation sublayer 148a and a second passivation sublayer 148b over the first passivation sublayer 148a. Further, a pad layer 402 is formed between the first and second passivation sublayers 148a, 148b. The pad layer 402 comprises a first pad structure 404a overhanging the first passivation sublayer 148a and extending through the first passivation sublayer 148a to the BTSV 412. The process for forming the passivation layer 148 and the pad layer 402 may, for example, be as described above in FIGS. 14A-14C.

As illustrated by the cross-sectional views 1600A-1600D of FIGS. 16A-16D, alternative embodiments of the BTSV are formed extending through the second semiconductor substrate 106b. In particular, as illustrated by the cross-sectional view 1600A of FIG. 16A, a first selective etch is performed into the second semiconductor substrate 106b to form a backside semiconductor opening 1602. The backside semiconductor opening 1602 is formed directly over the seal-ring structure 102 and extending to the second ILD layer 118a. The backside semiconductor opening 1602 has a width $W_6$ that may be, for example, about 2-5 micrometers, such as less than about 3.4 micrometers. The first selective etch may be performed selectively by, for example, photolithography.

Of note, some of the preceding embodiments illustrate the second device contact layer 124 as having a device contact immediately under a region of the second IC die 104b that corresponds to the backside semiconductor opening 1602. In some of the present embodiments, the device contact is omitted.

Figure 16A:
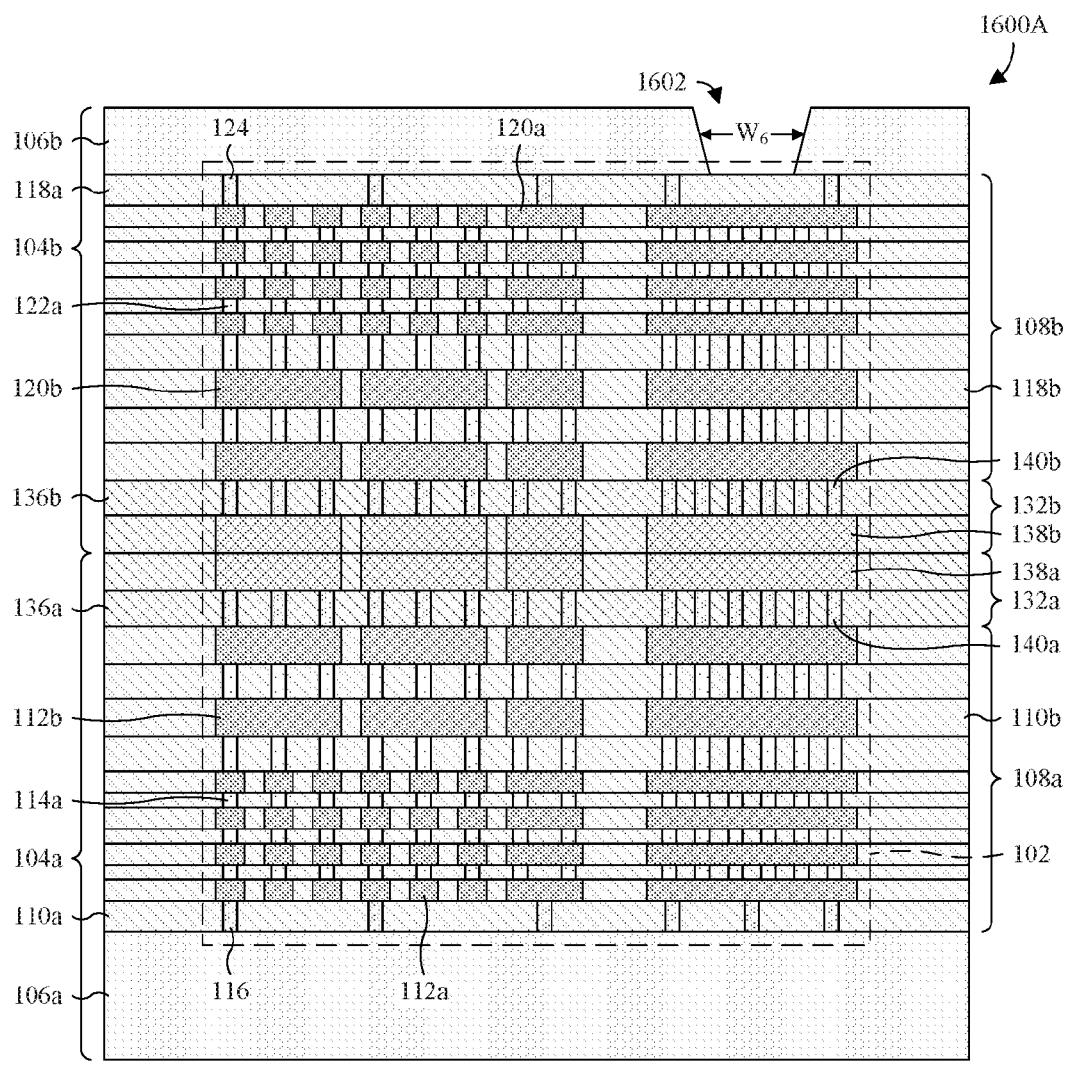
Figure 16B:
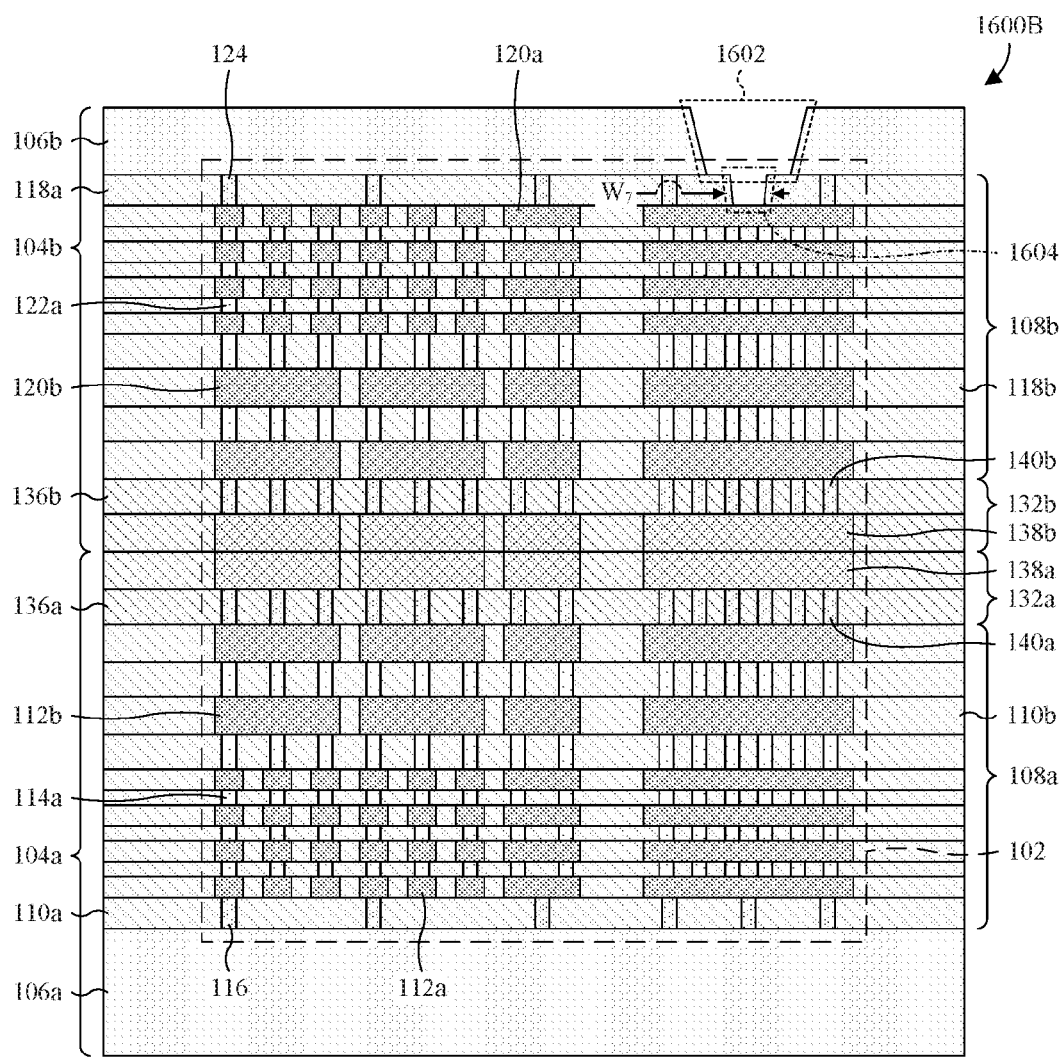

As illustrated by the cross-sectional view 1600B of FIG. 16B, a second selective etch is performed into the second ILD layer 118a and the second device contact layer 124 to form a backside contact opening 1604 directly over the seal-ring structure 102. Further, the backside contact opening 1604 is formed extending to a second wiring layer 120a nearest the second semiconductor substrate 106b, thereby exposing the second wiring layer 120a. The backside contact opening 1604 has a width $W_7$ that is less than that of the backside semiconductor opening 1602. The width $W_7$ may be, for example, about 1-3 micrometers, such as about 2.4 micrometers. The second selective etch may be performed selectively by, for example, photolithography.

Figure 16C:
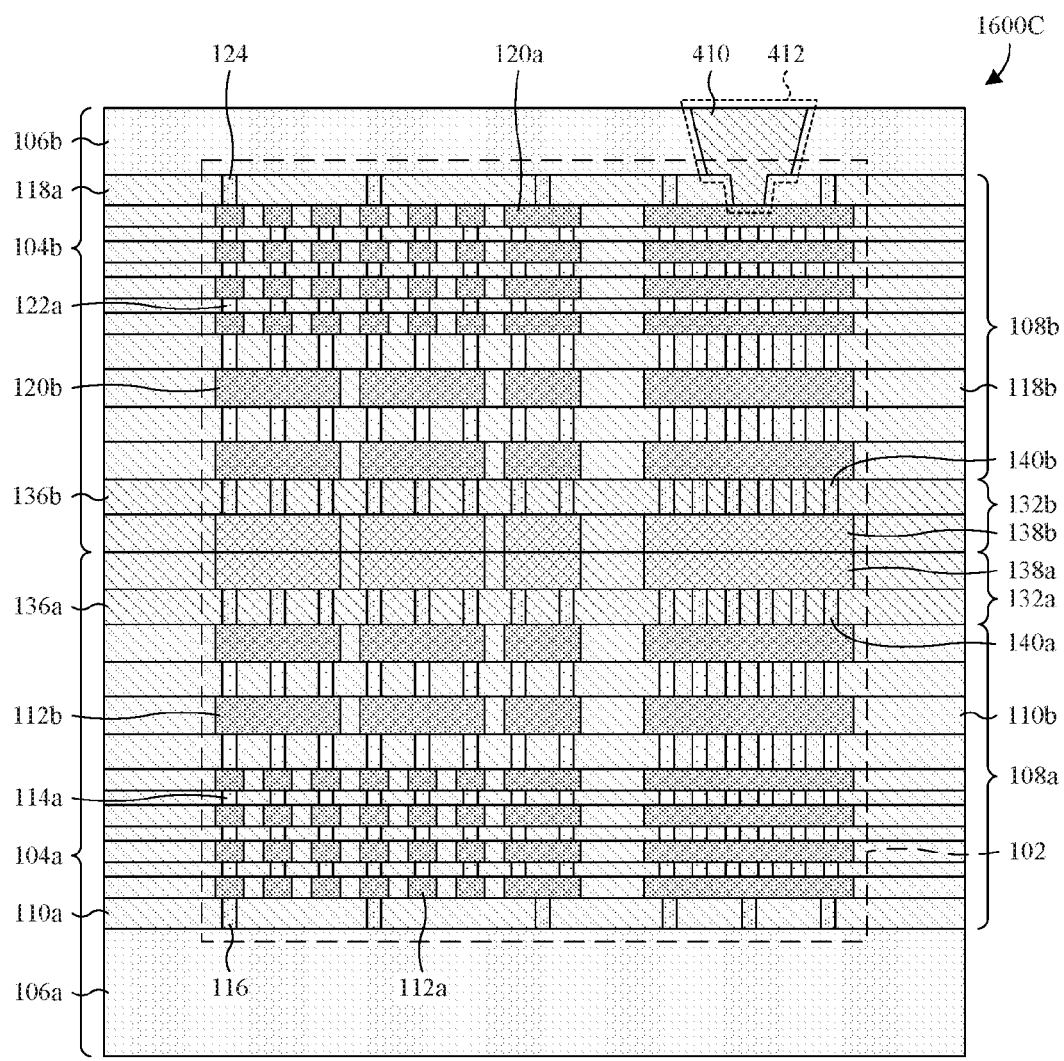

As illustrated by the cross-sectional view 1600C of FIG. 16C, a BTSV layer 410 is formed with a BTSV 412 filling the backside semiconductor opening 1602 (see, e.g., FIG. 16B) and the backside contact opening 1604 (see, e.g., FIG. 16B). The BTSV layer 410 is conductive and may be formed of, for example, aluminum, copper, aluminum copper, some other conductive material, a combination of the foregoing, or the like. The BTSV layer 410 may, for example, be formed as described in FIG. 15B.

Figure 16D:
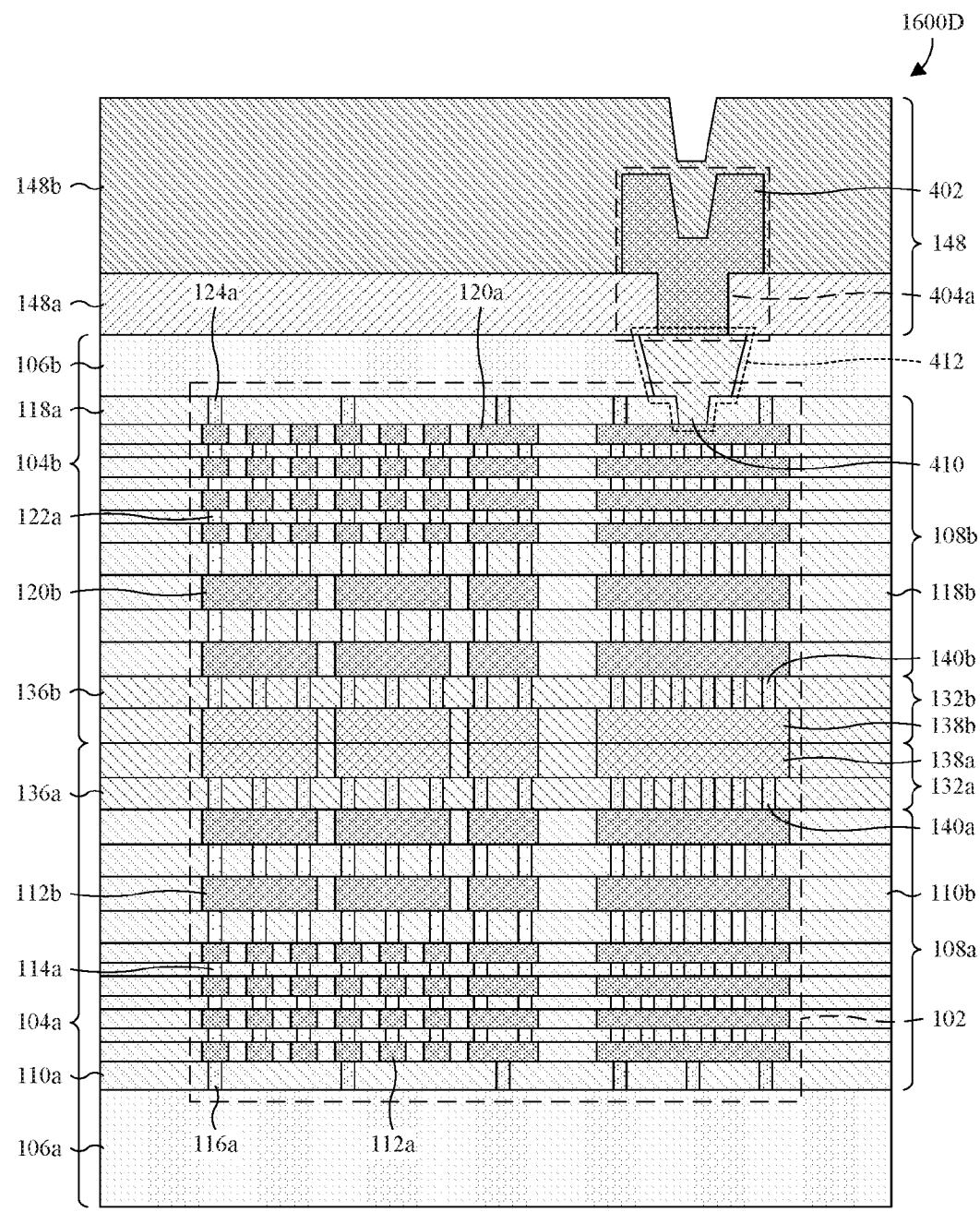

As illustrated by the cross-sectional view 1600D of FIG. 16D, a passivation layer 148 is formed covering the second semiconductor substrate 106b and the BTSV layer 410. The passivation layer 148 comprises a first passivation sublayer 148a and a second passivation sublayer 148b over the first passivation sublayer 148a. Further, a pad layer 402 is formed between the first and second passivation sublayers 148a, 148b. The pad layer 402 comprises a first pad structure 404a overhanging the first passivation sublayer 148a and extending through the first passivation sublayer 148a to the BTSV 412. The process for forming the passivation layer 148 and the pad layer 402 may, for example, be as described above in FIGS. 14A-14C.

Figure 17:
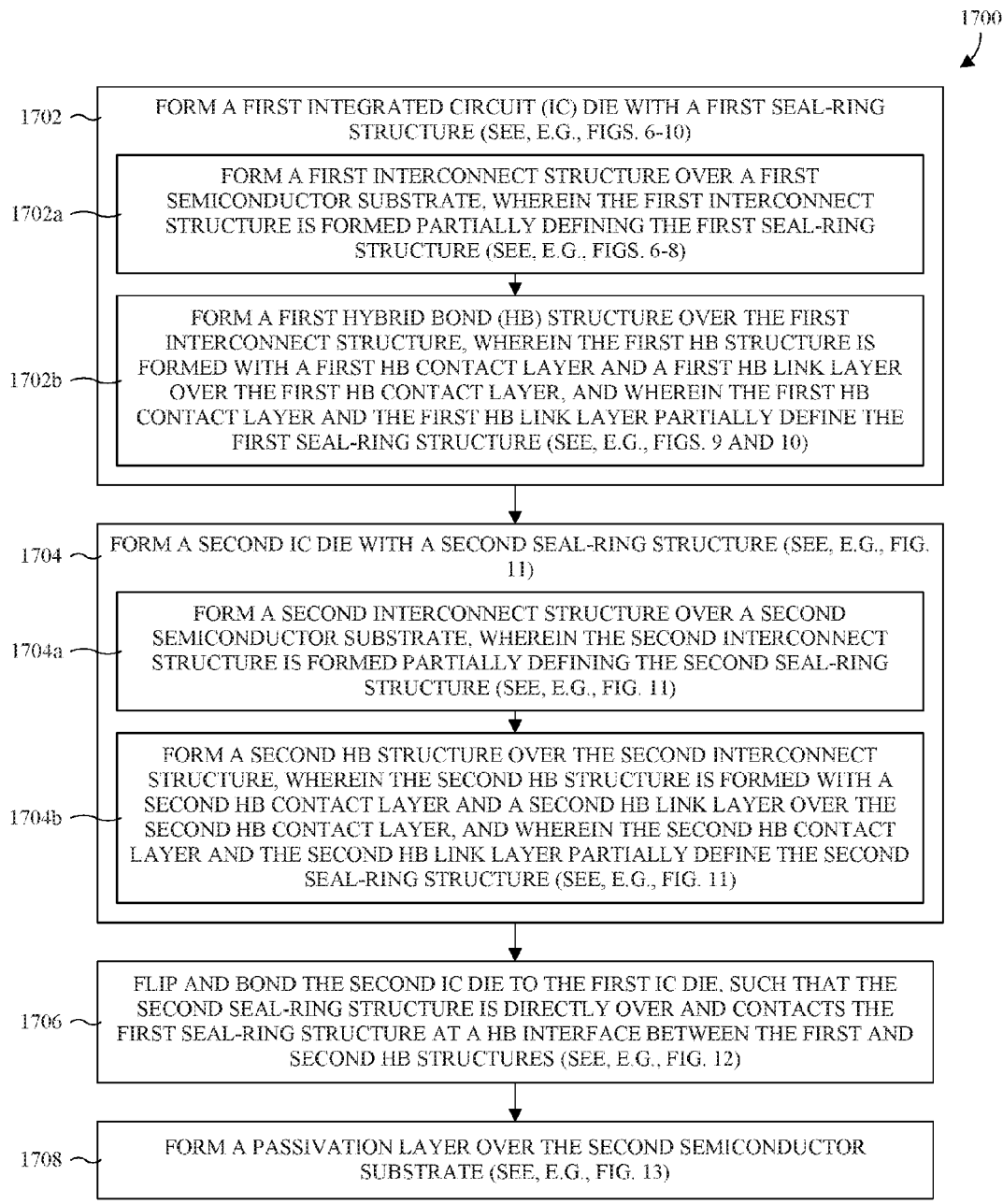
FIG. 17 illustrates a flowchart of some embodiments of the method of FIGS. 6-13, 14A-14C, 15A-15C, and 16A-16D.

With reference to FIG. 17, a flowchart 1700 of some embodiments of the method of FIGS. 6-13, 14A-14C, 15A-15C, and 16A-16D is provided.

At 1702, a first IC die with a first seal-ring structure is formed. See, for example, FIGS. 6-10. At 1702a, a first interconnect structure is formed over a first semiconductor substrate. The first interconnect structure is formed with an alternating stack of first wiring layers and first via layers that partially define the first seal-ring structure. See, for example, FIGS. 6-8. At 1702b, a first HB structure is formed over the first interconnect structure. The first HB structure is formed with a first HB contact layer and a first HB link layer over the first HB contact layer. Further, the first HB contact layer and the first HB link layer partially define the first seal-ring structure. See, for example, FIGS. 9 and 10.

At 1704, a second IC die with a second seal-ring structure is formed. See, for example, FIG. 11. At 1704a, a second interconnect structure is formed over a second semiconductor substrate. The second interconnect structure is formed with an alternating stack of second wiring layers and second via layers that partially define the second seal-ring structure. See, e.g., FIG. 11. At 1704b, a second HB structure is formed over the second interconnect structure. The second HB structure is formed with a second HB contact layer and a second HB link layer over the second HB contact layer. Further, the second HB contact layer and the second HB link layer partially define the second seal-ring structure. See, for example, FIG. 11.

At 1706, the second IC die is flipped and bonded to the first IC die, such that the second seal-ring structure is directly over and contacts the first seal-ring structure at an HB interface between the first and second HB structures. See, for example, FIG. 12.

At 1708, a passivation layer is formed over the second semiconductor substrate. See, for example, FIG. 13. In some embodiments, forming the passivation layer is preceded by thinning the second semiconductor substrate. The thinning may be performed by, for example, a planarization, such as CMP.

Figure 18A:
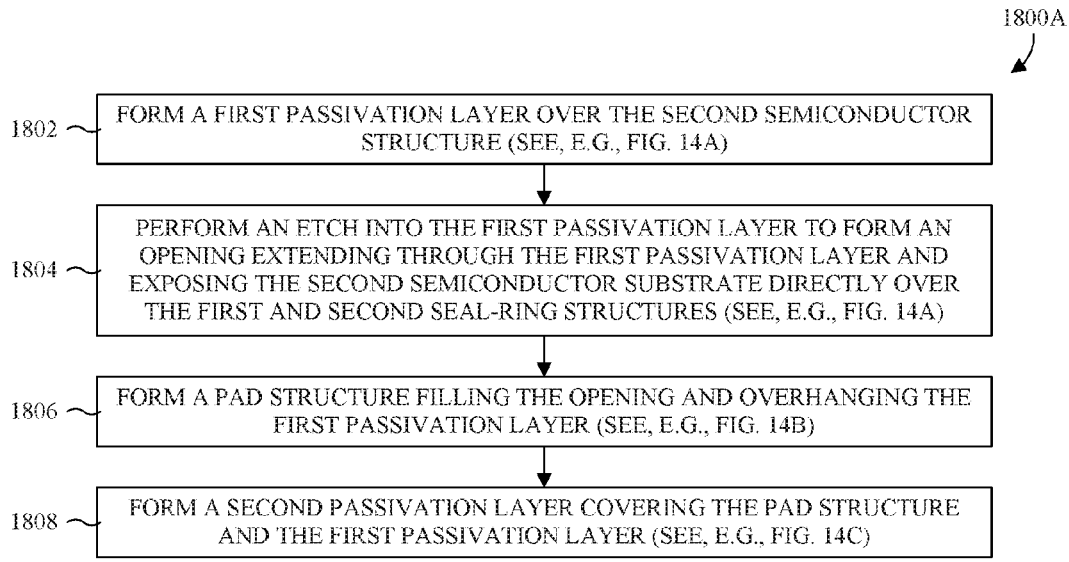
FIGS. 18A-18C illustrate flowcharts of various embodiments of a method that may be performed after flipping and bonding a second IC die to a first IC die in the method of FIG. 17.
Figure 18B:
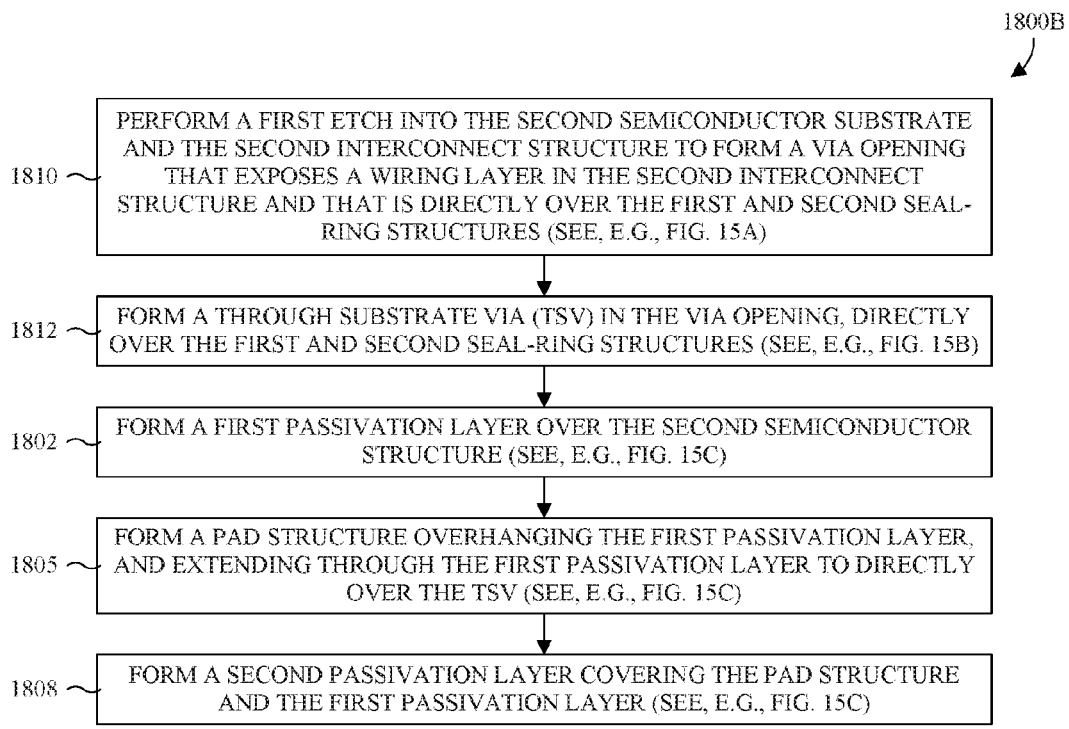
Figure 18C:
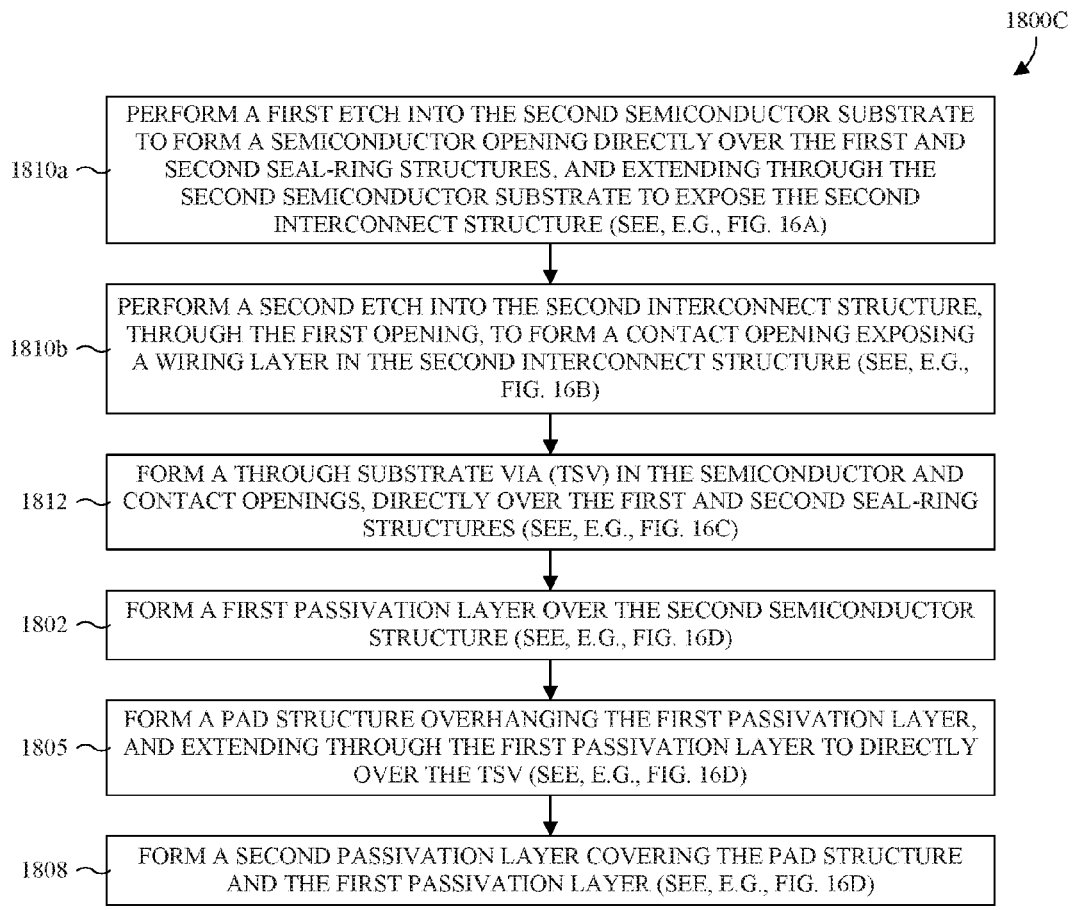

With reference to FIGS. 18A-18C, flowcharts 1800A-1800C of various embodiments of a method that may be performed after 1706 in FIG. 17 is provided. The various embodiments of the method may, for example, be performed in place of or concurrently with 1708 in FIG. 17 to form a backside structure over the second IC die.

As illustrated by the flowchart 1800A of FIG. 18A, a pad structure is formed over the second semiconductor substrate. At 1802, a first passivation layer is formed over the second semiconductor structure. See, for example, FIG. 14A. At 1804, an etch is performed into the first passivation layer to form a pad opening extending through the first passivation layer and exposing the second semiconductor substrate directly over the first and second seal-ring structures. See, for example, FIG. 14A. At 1806, a pad structure is formed filling the pad opening and overhanging the first passivation layer. See, for example, FIG. 14B. For example, forming the pad structure may comprise forming a pad layer covering the first passivation layer and filling the pad opening, and may further comprise patterning the pad layer to define the pad structure in the pad layer. At 1808, a second passivation layer is formed covering the pad structure and the first passivation layer. See, for example, FIG. 14C.

As illustrated by the flowchart 1800B of FIG. 18B, a TSV with continuous sidewalls is formed over the second IC die and a pad structure is subsequently formed. At 1810, a first etch is performed into the second semiconductor substrate and the second interconnect structure to form a TSV opening that exposes a wiring layer in the second interconnect structure and that is directly over the first and second seal-ring structures. See, for example, FIG. 15A. At 1812, a TSV is formed in the TSV opening, directly over the first and second seal-ring structures. See, for example, FIG. 15B. For example, forming the TSV may comprise forming a TSV layer covering the second semiconductor substrate and filling the via opening, and may further comprise coplanarizing a top surface of the pad layer with a top surface of the second semiconductor substrate to define the TSV. At 1802, a first passivation layer is formed over the second semiconductor structure and the TSV. See, for example, FIG. 15C. At 1805, a pad structure is formed overhanging the first passivation layer, and extending through the first passivation layer to directly over the TSV. See, for example, FIG. 15C. The pad structure may be formed as described at 1804 and 1806 in FIG. 18A. At 1808, a second passivation layer is formed covering the pad structure and the first passivation layer. See, for example, FIG. 15C.

As illustrated by the flowchart 1800C of FIG. 18C, a variant of FIG. 18B is provided in which the TSV is formed with discontinuous sidewalls. At 1810a, a first etch is performed into the second semiconductor substrate to form a semiconductor opening directly over the first and second seal-ring structures, and extending through the second semiconductor substrate to expose the second interconnect structure. See, for example, FIG. 16A. At 1810b, a second etch is performed into the second interconnect structure, through the first opening, to form a contact opening exposing a wiring layer in the second interconnect structure. See, for example, FIG. 16B. At 1812, a TSV is formed in the semiconductor and contact openings, directly over the first and second seal-ring structures. See, for example, FIG. 16C. Thereafter, 1802, 1805, and 1808 are performed as described in FIG. 18B. See, for example, FIG. 16D.

While the flowcharts 1700, 1800A-1800C of FIGS. 17 and 18A-18C are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, some embodiments of the present application provide a 3D IC die. A first IC die comprises a first semiconductor substrate, a first interconnect structure over the first semiconductor substrate, and a first HB structure over the first interconnect structure. The first HB structure comprises a HB link layer and a HB contact layer extending from the HB link layer to the first interconnect structure. A second IC die is over the first IC die. The second IC die comprises a second semiconductor substrate, a second HB structure, and a second interconnect structure between the second semiconductor substrate and the second HB structure. The second HB structure contacts the first HB structure at a HB interface. A seal-ring structure is in the first and second IC dies. The seal-ring structure extends from the first semiconductor substrate to the second semiconductor substrate. Further, the seal-ring structure is defined in part by the HB contact layer.

Further, other embodiments of the present application provide a method for manufacturing a 3D IC die. A first IC die with a first seal-ring structure is formed. Forming the first IC die comprises forming a first interconnect structure over a first semiconductor substrate, a first HB contact layer over the first interconnect structure, and a first HB link layer over the first HB contact layer. The first interconnect structure, the first HB contact layer, and the first HB link layer are formed defining the first seal-ring structure. A second IC die with a second seal-ring structure is formed. Forming the second IC die comprises forming a second interconnect structure over a second semiconductor substrate, a second HB contact layer over the second interconnect structure, and a second HB link layer over the second HB contact layer. The second interconnect structure, the second HB contact layer, and the second HB link layer are formed defining the second seal-ring structure. The second IC die is flipped and bonded to the first IC die, such that the second seal-ring structure is directly over and contacts the first seal-ring structure at a HB interface between the first and second HB link layers.

Further yet, other embodiments of the present application provide another 3D IC die. A second IC die is over a first IC die. The first and second IC dies comprise respective semiconductor substrates, respective interconnect structures between the semiconductor substrates, and respective HB structures between the interconnect structures. The interconnect structures comprise alternating stacks of wiring layers and via layers. The HB structures comprise respective HB dielectric layers, respective HB link layers, and respective HB contact layers. The HB dielectric layers contact at a HB interface between the first and second IC dies. The HB link layers are in the HB dielectric layers and contact at the HB interface. The HB contact layers extend respectively from the HB link layers respectively to the interconnect structures. A conductive seal-ring structure is in the first and second IC dies. The conductive seal-ring structure extends respectively from and to the semiconductor substrates to define a barrier around an interior of the first and second IC dies. The seal-ring structure is defined by the wiring layers, the via layers, the HB link layers, and the HB contact layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional (3D) integrated circuit (IC) die comprising:
   a first IC die comprising a first semiconductor substrate, a first interconnect structure over the first semiconductor substrate, and a first hybrid bond (HB) structure over the first interconnect structure, wherein the first HB structure comprises a HB link layer and a HB contact layer extending from the HB link layer to the first interconnect structure;
   a second IC die over the first IC die, wherein the second IC die comprises a second semiconductor substrate, a second HB structure, and a second interconnect structure between the second semiconductor substrate and the second HB structure, and wherein the second HB structure contacts the first HB structure at a HB interface; and
   a seal-ring structure in the first and second IC dies, wherein the seal-ring structure extends from the first semiconductor substrate to the second semiconductor substrate, and wherein the seal-ring structure is defined in part by the HB contact layer.

2. The 3D IC die according to claim 1, wherein the seal-ring structure is conductive and defines a conductive path through the HB contact layer, respectively from the first interconnect structure to the second interconnect structure.

3. The 3D IC die according to claim 1, wherein the first interconnect structure comprises a first interlayer dielectric (ILD) layer, first wiring layers, and first via layers, wherein the first wiring layers and the first via layers are alternatingly stacked in the first ILD layer, and wherein the HB link layer extends to a top one of the first wiring layers.

4. The 3D IC die according to claim 3, wherein the second interconnect structure comprises a second ILD layer, second wiring layers, and second via layers, wherein the second wiring layers and the second via layers are alternatingly stacked in the second ILD layer, and wherein the second HB structure comprises a second HB link layer and a second HB contact layer extending from the second HB link layer to the second interconnect structure.

5. The 3D IC die according to claim 1, wherein the first and second HB structures comprise respective HB dielectric layers contacting at the HB interface, wherein the second HB structure comprises a second HB link layer contacting the HB link layer at the HB interface, and wherein the HB link layer and the second HB link layer are respectively sunk into the HB dielectric layers, such that the HB link layer and the second HB link layer are flush with the HB dielectric layers at the HB interface.

6. The 3D IC die according to claim 1, further comprising:
   a passivation layer covering the second IC die; and
   a pad structure directly over the seal-ring structure, wherein the pad structure overhangs the passivation layer and extends through the passivation layer to the second semiconductor substrate.

7. The 3D IC die according to claim 6, further comprising:
   a through substrate via (TSV) extending through the second semiconductor substrate, from contact with the pad structure to the second interconnect structure, wherein sidewalls of the TSV are continuous from the pad structure to the second interconnect structure.

8. The 3D IC die according to claim 6, further comprising:
   a through substrate via (TSV) extending through the second semiconductor substrate, from contact with the pad structure to the second interconnect structure, wherein sidewalls of the TSV are discontinuous from the pad structure to the second interconnect structure.

9. The 3D IC die according to claim 1, wherein the seal-ring structure comprises a plurality of ring-shaped segments that are concentrically aligned, wherein one of the ring-shaped segments comprises HB contacts of the HB contact layer and HB links of the HB link layer, and wherein another one of the ring-shaped segments is without HB contacts of the HB contact layer and HB links of the HB link layer.

10. The 3D IC die according to claim 1, further comprising:
a three-dimensional (3D) IC arranged in the first and second IC dies, wherein the seal-ring structure laterally encloses the 3D IC so as to protect the 3D IC.

11. A method for manufacturing a three-dimensional (3D) integrated circuit (IC) die, the method comprising:
forming a first IC die with a first seal-ring structure, wherein forming the first IC die comprises forming a first interconnect structure over a first semiconductor substrate, a first HB contact layer over the first interconnect structure, and a first HB link layer over the first HB contact layer, and wherein the first interconnect structure, the first HB contact layer, and the first HB link layer are formed defining the first seal-ring structure;
forming a second IC die with a second seal-ring structure, wherein forming the second IC die comprises forming a second interconnect structure over a second semiconductor substrate, a second HB contact layer over the second interconnect structure, and a second HB link layer over the second HB contact layer, and wherein the second interconnect structure, the second HB contact layer, and the second HB link layer are formed defining the second seal-ring structure; and
flipping and bonding the second IC die to the first IC die, such that the second seal-ring structure is directly over and contacts the first seal-ring structure at a HB interface between the first and second HB link layers.

12. The method according to claim 11, wherein forming the first interconnect structure comprises forming an alternating stack of via layers and wiring layers over the first semiconductor substrate, wherein the first HB contact layer is formed over and contacting a top one of the wiring layers, and wherein the first HB link layer is formed over and contacting the first HB contact layer.

13. The method according to claim 11, wherein the first IC die is formed such that the first seal-ring structure defines a conductive path from the first semiconductor substrate to the first HB link layer.

14. The method according to claim 11, further comprising:
forming a passivation layer covering the second IC die;
performing a first etch into the passivation layer to form a pad opening directly over the first and second seal-ring structures, wherein the pad opening exposes the second semiconductor substrate;
forming a pad layer filling the pad opening and covering the passivation layer; and
performing a second etch into the pad layer to define a pad structure in the pad opening.

15. The method according to claim 11, further comprising:
performing an etch into the second semiconductor substrate and the second interconnect structure to form a via opening, wherein the via opening exposes a wiring layer in the second interconnect structure and is directly over the first and second seal-ring structures;
forming a through substrate via (TSV) filling the via opening with an upper surface that is even with an upper surface of the second semiconductor substrate;
forming a passivation layer over the second semiconductor substrate and the TSV; and
forming a pad structure directly over the TSV, wherein the pad structure overhangs the passivation layer and extends through the passivation layer to the TSV.

16. The method according to claim 11, further comprising:
performing a first etch into the second semiconductor substrate to form a semiconductor opening, wherein the semiconductor opening is directly over the first and second seal-ring structures;
performing a second etch into the second interconnect structure, through the semiconductor opening, to form a contact opening, wherein the contact opening exposes a wiring layer in the second interconnect structure and has a smaller width than the semiconductor opening; and
forming a through substrate via (TSV) filling the semiconductor and contact openings with an upper surface that is even with an upper surface of the second semiconductor substrate.

17. The method according to claim 16, further comprising:
forming a passivation layer over the second semiconductor substrate and the TSV; and
forming a pad structure directly over the TSV, wherein the pad structure overhangs the passivation layer and extends through the passivation layer to the TSV.

18. The method according to claim 11, wherein the first seal-ring structure comprises a plurality of ring-shaped segments that are concentric, wherein the first HB contact layer and the first HB link layer are respectively formed with HB contacts and HB links at a first one of the ring-shaped segments, and wherein the first HB contact layer and the first HB link layer are respectively formed without HB contacts and without HB links at a second one of the ring-shaped segments.

19. A three-dimensional (3D) integrated circuit (IC) die comprising:
a first IC die and a second IC die over the first IC die, wherein the first and second IC dies comprise respective semiconductor substrates, respective interconnect structures between the semiconductor substrates, and respective hybrid bond (HB) structures between the interconnect structures, wherein the interconnect structures comprise alternating stacks of wiring layers and via layers, wherein the HB structures comprise respective HB dielectric layers, respective HB link layers, and respective HB contact layers, wherein the HB dielectric layers contact at a HB interface between the first and second IC dies, wherein the HB link layers are in the HB dielectric layers and contact at the HB interface, and wherein the HB contact layers extend respectively from the HB link layers respectively to the interconnect structures; and
a conductive seal-ring structure in the first and second IC dies, wherein the conductive seal-ring structure extends respectively from and to the semiconductor substrates to define a barrier around an interior of the first and second IC dies, and wherein the conductive seal-ring structure is defined by the wiring layers, the via layers, the HB link layers, and the HB contact layers.

20. The 3D IC die according to claim 19, wherein the conductive seal-ring structure comprises a plurality of ring-shaped segments that are concentrically aligned, wherein one of the ring-shaped segments comprises HB contacts of the HB contact layers and HB links of the HB link layers, and wherein another one of the ring-shaped segments is without HB contacts of the HB contact layers and HB links of the HB link layers.

* * * * *